(12) United States Patent
Sasaki et al.

(10) Patent No.: US 6,750,149 B2
(45) Date of Patent: Jun. 15, 2004

(54) METHOD OF MANUFACTURING ELECTRONIC DEVICE

(75) Inventors: Tomoyuki Sasaki, Kyoto (JP); Takao Yamaguchi, Kyoto (JP); Hideo Nikoh, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/043,257

(22) Filed: Jan. 14, 2002

(65) Prior Publication Data

US 2002/0119646 A1 Aug. 29, 2002

Related U.S. Application Data

(63) Continuation-in-part of application No. 09/330,018, filed on Jun. 11, 1999, now abandoned.

(30) Foreign Application Priority Data

Jun. 12, 1998 (JP) ............................................. 10-164594

(51) Int. Cl.⁷ ..................... H01L 21/302; H01L 21/461; B01B 6/00
(52) U.S. Cl. ..................... 438/705; 438/723; 438/725; 134/1.2
(58) Field of Search ................................ 438/705, 723, 438/725; 134/1.2

(56) References Cited

U.S. PATENT DOCUMENTS

| 5,264,076 A | * | 11/1993 | Cuthbert et al. ............ 438/751 |
| 5,324,689 A | * | 6/1994 | Yoo .............................. 438/585 |
| 5,593,917 A | | 1/1997 | Nuyen |
| 5,674,357 A | * | 10/1997 | Sun et al. .................... 134/1.2 |
| 5,872,061 A | * | 2/1999 | Lee et al. .................... 438/705 |
| 5,880,019 A | | 3/1999 | Hsieh et al. |
| 5,904,570 A | * | 5/1999 | Chen et al. .................. 438/725 |
| 5,906,912 A | * | 5/1999 | Watanabe et al. ........... 430/317 |

FOREIGN PATENT DOCUMENTS

| JP | 63-284861 A | 11/1988 |
| JP | 02-291125 A | 11/1990 |
| JP | 03-262122 A | 11/1991 |
| JP | 05-109702 A | 4/1993 |
| JP | 05-136135 A | 6/1993 |
| JP | 07-37780 A | 2/1995 |
| JP | 07-130707 A | 5/1995 |
| JP | 07-249572 A | 9/1995 |
| JP | 09-260346 A | 10/1997 |
| JP | 10-065000 A | 3/1998 |

OTHER PUBLICATIONS

S. Wolf and R.N. Taubler, Silicon Processing for the VLSI Era, vol. L pp. 555–556, 569 and 575.

* cited by examiner

Primary Examiner—Long Pham
Assistant Examiner—Shrinivas H. Rao
(74) Attorney, Agent, or Firm—Nixon Peabody LLP; Donald R. Studebaker

(57) ABSTRACT

After forming an insulating film on an underlying layer, a resist pattern is formed on the insulating film. The insulating film is etched by using the resist pattern as a mask, thereby forming an insulating film pattern. Without removing the resist pattern, exposed portions of the underlying layer and the insulating film pattern are subjected to a plasma treatment, cleaning, a heat treatment or the like, so that a deposition grown during the formation of the insulating film pattern can be removed. Thereafter, the underlying layer is etched by using at least the insulating film pattern as a mask. As a result, even when a strict pattern rule is employed, pattern defects can be prevented from being caused in etching a multi-layer film.

2 Claims, 29 Drawing Sheets

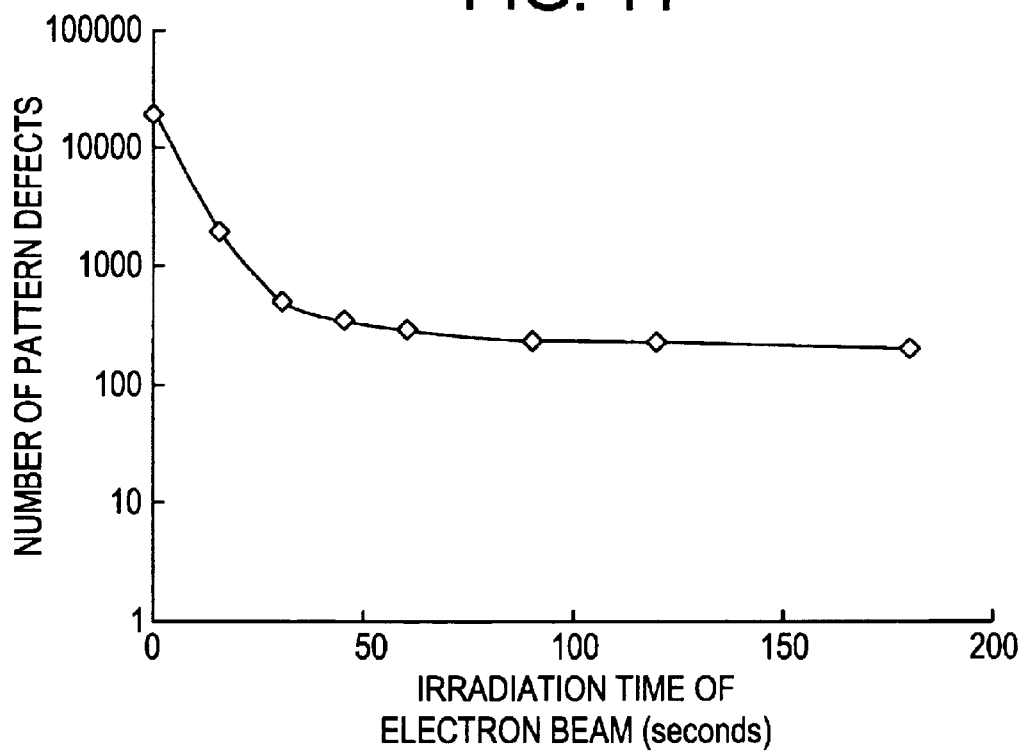

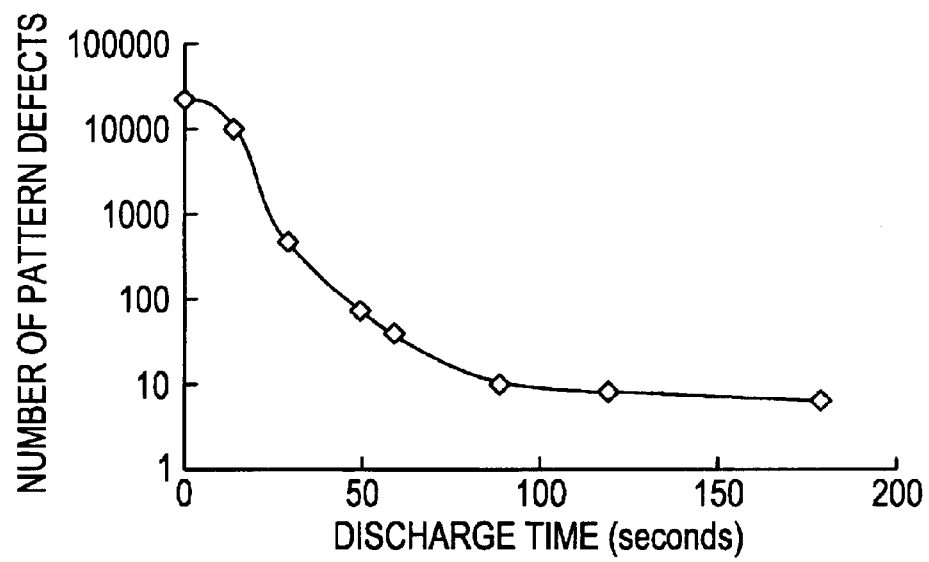

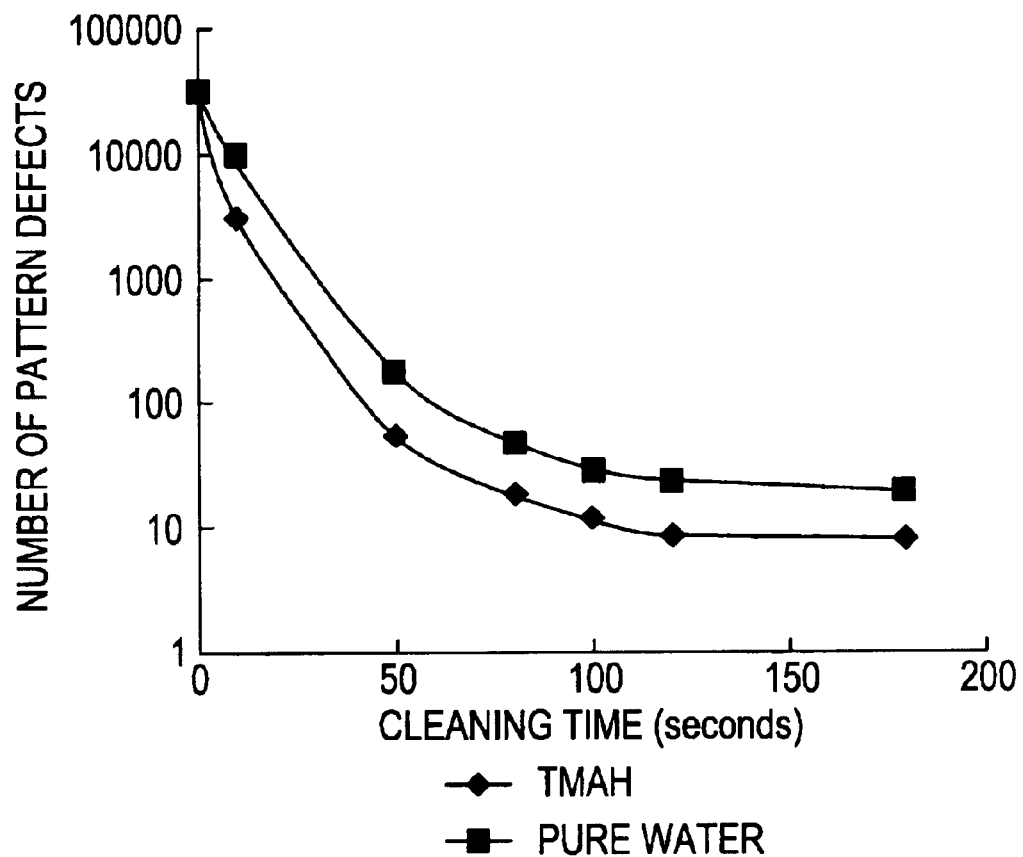

METHOD OF MANUFACTURING ELECTRONIC DEVICE

BACKGROUND OF THE INVENTION

The present invention relates to a method of manufacturing an electronic device including a semiconductor device.

In accordance with recent high integration of electronic devices including semiconductor devices, patterns used for the manufacture of the devices have become more and more refined. For example, in a process for patterning a gate electrode of a MOS transistor used in a dynamic random access memory (DRAM), a microcomputer or the like from a polysilicon film, a gate processing technique using a hard mask such as a silicon nitride film has been put in practical use. In photolithography preceding this gate processing, in order to further refine a resist mask, a resist film to be used has become thinner and thinner so as to improve the resolution of the resist mask and increase the depth of focus.

In this case, in dry etching for forming a gate electrode by patterning a polysilicon film, a WSi polycide film and a polymetallic film, a resist film serving as an etching mask is partially etched. Therefore, the thickness of the resist film is decreased (or the resist film is removed in some cases), resulting in degrading the patterning accuracy. As a technique to overcome this problem, a hard mask of a nitride or oxide film having high selectivity against polysilicon, WSi polycide and polymetal is formed on the polysilicon film, the WSi polycide film and the polymetallic film. Specifically, not only the resist film but also the hard mask are used as a mask in the patterning, so that the problem derived from the thickness decrease of the resist film can be solved.

As another example of the formation of a surface protecting film as described above, a process for forming a SAC (self align contact) will be described. In the SAC process, there is no need to align a mask for a gate electrode against a mask for a contact but it is necessary to definitely prevent contact between the gate electrode and the contact. Therefore, a surface protecting film (hard mask) of a silicon nitride film is formed on the gate electrode, so that the upper surface of the gate electrode can be definitely prevented from coming in contact with the contact. When the surface protecting film is to be formed on the gate electrode in this manner, conductive films for the gate electrode (such as a polysilicon film, a polycide film and a polymetallic film) and a silicon nitride film are deposited, and thereafter, a resist mask formed thereon is used in successively etching the silicon nitride film, the polysilicon film and the like.

The etching carried out in this case will now be described. FIGS. 22(a) through 22(c) are sectional views for showing conventional procedures for successively etching the nitride film and the polysilicon film.

In the procedure shown in FIG. 22(a), a gate oxide film 102 with a thickness of 10 nm and a polysilicon film 103 with a thickness of 250 nm are successively formed on a silicon substrate 101, and a silicon nitride film 104 with a thickness of 150 nm is deposited on the polysilicon film 103. Thereafter, the silicon nitride film 104 is coated with a chemically amplified resist, which is formed into a resist mask 105 by photolithography using KrF excimer laser.

Next, in the procedure shown in FIG. 22(b), the resist mask 105 is used as an etching mask for etching the silicon nitride film 104, thereby forming a surface protecting film 106.

Then, in the procedure shown in FIG. 22(c), without removing the resist mask 105, the underlying polysilicon film 103 is etched, so as to form a polysilicon pattern 108 functioning as a gate electrode above an active area. At this point, as is shown in FIG. 22(c), the resist mask 105 is etched to some extent and the lateral dimension and shape thereof are spoiled, but the surface protecting film 106 of the silicon nitride film having high etching selectivity against polysilicon is scarcely etched. In other words, the polysilicon pattern 108 is formed by using the resist mask 105 and the surface protecting film 106 as the mask.

Also, in a process for forming a metallic line by patterning a metallic film, the metallic film for the line is conventionally patterned by using a hard mask for metal in some cases.

FIGS. 23(a) through 23(d) are sectional views for showing the conventional procedures for forming a metallic line layer.

First, in the procedure shown in FIG. 23(a), a TiN film 112 with a thickness of 50 nm, an aluminum film 113 with a thickness of 0.45 µm and a TiN film 114 with a thickness of 30 nm are successively deposited by reactive sputtering and general sputtering on a silicon oxide film 111 (such as an interlayer insulating film or an isolation insulating film) formed on a substrate. On the TiN film 114, a silicon oxide film 115 with a thickness of 150 nm is deposited by plasma CVD.

Thereafter, the silicon oxide film 115 is coated with a chemically amplified resist so as to form a resist film, which is formed into a resist mask 116 with a thickness of 0.7 µm by the lithography using KrF excimer laser.

Then, in the procedure shown in FIG. 23(b), the silicon oxide film 115 is dry etched by using a dry etcher with the resist mask 116 used as an etching mask. Thus, a hard mask 117 for metal is formed. At this point, the TiN film 114 is also partially etched through over-etching.

Next, in the procedure shown in FIG. 23(c), the resist film 116 is removed through ashing and cleaning. The ashing is conducted by a down stream method using microwaves, and an aqueous solution of ammonium fluoride is used as the cleaning solution.

Thereafter, in the procedure shown in FIG. 23(d), by using the hard mask 117 for metal as an etching mask, the underlying metallic films (the stacked films including the TiN film 114, the aluminum film 113 and the TiN film 112) are etched by using a metal dry etcher, thereby forming a metallic pattern (metallic line) 119.

However, since the silicon nitride film and the underlying polysilicon film and the like are successively etched as described above referring to FIGS. 22(a) through 22(c), the dimension of the polysilicon pattern 108 formed by dry etching the polysilicon film and the like can be much larger than the dimension of the surface protecting film 106, and the shape of the polysilicon pattern 108 can be spoiled (which are designated as pattern defects).

The present inventors studied the cause of these defects, resulting in finding the following: After etching the silicon nitride film 104 in the procedure shown in FIG. 22(b), a small deposition 107 with a size of 0.03 µm or less is grown as a contaminant in the vicinity of the interface between the resist mask 105 and the surface protecting film 106. This deposition 107 works as an etching mask for the polysilicon film 103, resulting in causing a pattern defect that the dimension of the polysilicon pattern 108 partly deviates from the designed dimension. It was found that such phenomenon occurs not only when a polysilicon film is formed below a silicon nitride film but also a W (tungsten) film, a silicon oxide film, a WSi (tungsten silicide) film, a silicon oxinitride film or the like is formed below.

When the polysilicon film 103 formed below the silicon nitride film 104 is not continuously etched after etching the silicon nitride film 104, the deposition 107 formed on the side of the surface protecting film 106 can be easily removed by ashing, or cleaning the wafer with sulfuric acid-hydrogen peroxide (an aqueous solution of sulfuric acid and hydrogen peroxide) or ammonia-hydrogen peroxide (an aqueous solution of ammonia and hydrogen peroxide). However, the resist mask 105 serving as the etching mask is also removed through this process. When the polysilicon film 103 is etched by using the surface protecting film 106 alone as the mask with the resist mask 105 removed, the surface protecting film 106 cannot be prevented from being etched at all but can be etched to some extent, resulting in decreasing the thickness of the surface protecting film 106 to some extent. Since it is difficult to control the etch amount of the surface protecting film 106 in this case, the thickness of the surface protecting film 106 is varied between lots. Therefore, it is difficult to accurately attain the predetermined designed thickness of the surface protecting film 106. Since it is necessary to accurately control the thickness of the surface protecting film 106 in the SAC process, it is desired to avoid removal of the resist mask 105 as far as possible.

Furthermore, it was found, also in the process for forming the metallic line, that a deposition 118 is locally grown as a contaminant on the TiN film 114 after the etching for forming the hard mask 117 for metal as is shown in FIG. 23(b). Such a reaction product exists comparatively unstably, but when the underlying metallic films (including the TiN film 114, the aluminum film 113 and the TiN film 112) are etched with the deposition 118 remaining, the deposition 118 works as a micromask as is shown in FIG. 23(d), resulting in forming an etching remainder portion 120 (pattern defect) in the metallic pattern 119 formed by patterning the metallic films. In addition, when the substrate is exposed to the air with the deposition 118 remaining, it is difficult to remove the deposition 118 even through ashing and cleaning are carried out thereafter.

SUMMARY OF THE INVENTION

An object of the invention is suppressing pattern defects from being caused after patterning an underlying layer by providing means for effectively removing the aforementioned deposition or suppressing the growth of the deposition after successively etching a hard mask film and the underlying layer below.

The first method of manufacturing an electronic device of this invention comprises the steps of (a) forming, on an underlying layer, an insulating film made from one of an oxide film, a nitride film, an oxinitride film and an organic-inorganic hybrid film; (b) forming a resist pattern on the insulating film; (c) forming an insulating film pattern by etching the insulating film with the resist pattern used as a mask; (d) conducting a plasma treatment on exposed portions of the underlying layer and the insulating film pattern without removing the resist pattern after the step (c); and (e) etching the underlying layer with the resist pattern and the insulating film pattern used as a mask.

In this method, a deposition grown in the vicinity of the interface between the resist pattern and the insulating film pattern is removed through the plasma treatment carried out after etching the insulating film. Accordingly, the resultant electronic device includes few pattern defects in an underlying layer pattern formed from the underlying layer.

In the first method of manufacturing an electronic device, the plasma treatment can be conducted by using a gas including at least one of a $N_2$ gas, an $O_2$ gas and an inert gas in the step (d).

In the first method of manufacturing an electronic device, when the underlying layer is made from one of a monosilicon layer, a silicon substrate, a polysilicon film, an amorphous silicon film, an organic film, an organic-inorganic hybrid film, a nitride film and an oxide film, the underlying layer can be etched with a chlorine-containing gas or a bromine-containing gas in the step (e). Such etching gases exhibit the etching function by utilizing a radical reaction, and hence are advantageous in minimally damaging a silicon layer.

In this case, when the insulating film is a silicon nitride film, the insulating film of the silicon nitride film can be etched with a fluorine-containing gas in the step (c).

The underlying layer is preferably one of a surface portion of a silicon substrate, an electrode, an interconnect and an interlayer insulating film.

The second method of manufacturing an electronic device of this invention comprises the steps of (a) forming an insulating film on an underlying layer; (b) forming a resist pattern on the insulating film; (c) forming an insulating film pattern by etching the insulating film with the resist pattern used as a mask; (d) cleaning the underlying layer after the step (c); and (e) etching the underlying layer with at least the insulating film pattern used as a mask.

In this method, a deposition grown in the vicinity of the interface between the resist pattern and the insulating film pattern is removed by cleaning the underlying layer after etching the insulating film. Accordingly, the resultant electronic device includes few pattern defects in an underlying layer pattern formed from the underlying layer.

In the second method of manufacturing an electronic device, when water is used as a cleaning solution in the step (d), the deposition can be definitely removed without leaving any impurity on the substrate.

In this case, when the cleaning solution is kept at 50° C. or more, the deposition can be more effectively removed.

In the second method of manufacturing an electronic device, when the deposition is made from an acidic material, an aqueous solution of TMAH (tetramethyl ammonium hydride) is preferably used as a cleaning solution in the step (d), and when the deposition is made from an alkaline material, a diluted hydrofluoric acid aqueous solution is preferably used as a cleaning solution in the step (d).

In the second method of manufacturing an electronic device, when the insulating film is a silicon nitride film or a silicon oxinitride film, the method can further comprise a step of exposing a substrate to the air between the step (c) and the step (d). Also in this case, the effect to remove the deposition can be exhibited as far as the insulating film is a silicon nitride film or a silicon oxinitride film.

In the second method of manufacturing an electronic device, when the underlying layer is made from one of a monosilicon layer, a silicon substrate, a polysilicon film, an amorphous silicon film, an organic film, an organic-inorganic hybrid film, a nitride film and an oxide film, the underlying layer can be etched with a chlorine-containing gas or a bromine-containing gas in the step (e). Such etching gases exhibit the etching function by utilizing a radical reaction, and hence are advantageous in minimally damaging a silicon layer although not used in etching polysilicon and a metal.

In this case, when the insulating film is a silicon nitride film, the insulating film of the silicon nitride film can be etched with a fluorine-containing gas in the step (c).

The third method of manufacturing an electronic device of this invention comprises the steps of (a) forming an insulating film on an underlying layer; (b) forming a resist pattern on the insulating film; (c) forming an insulating film pattern by etching the insulating film with the resist pattern used as a mask; (d) conducting a heat treatment on a substrate without removing the resist pattern after the step (c); and (e) etching the underlying layer with the resist pattern and the insulating film pattern used as a mask.

In this method, the heat treatment is conducted after etching the insulating film, thereby removing a deposition grown in the vicinity of the interface between the resist pattern and the insulating film pattern. Accordingly, the resultant electronic device includes few pattern defects caused in an underlying layer pattern formed from the underlying layer.

In the third method of manufacturing an electronic device, when the heat treatment is conducted under vacuum in the step (d), the growth of the deposition can be suppressed because a water component is not absorbed by the resist pattern and the insulating film pattern.

The fourth method of manufacturing an electronic device of this invention comprises the steps of (a) forming an insulating film on an underlying layer of titanium nitride; (b) forming a resist pattern on the insulating film; (c) forming an insulating film pattern by etching the insulating film with the resist pattern used as a mask; (d) conducting a plasma treatment on exposed portions of the underlying layer and the insulating film pattern after the step (c); and (e) etching the underlying layer with the insulating film pattern used as a mask by using a halogen-containing gas.

The fifth method of manufacturing an electronic device of this invention comprises the steps of (a) forming an insulating film including nitrogen on an underlying layer; (b) conducting a heat treatment on the insulating film for removing $NH_x$, wherein x is an arbitral value; (c) forming a resist pattern on the insulating film; (d) forming an insulating film pattern by etching the insulating film with the resist pattern used as a mask; and (e) etching the underlying layer with the resist pattern and the insulating film pattern used as a mask.

In this method, the insulating film is etched after removing an impurity through the heat treatment, and hence, a reaction product can be prevented from being produced in etching the insulating film. Accordingly, the growth of a deposition in the vicinity of the interface between the resist pattern and the insulating film pattern can be suppressed, and hence, the resultant electronic device includes few pattern defects caused in an underlying layer pattern formed from the underlying layer.

The sixth method of manufacturing an electronic device of this invention comprises the steps of (a) forming an insulating film on an underlying layer; (b) forming a protecting film on the insulating film; (c) forming a resist pattern on the protecting film; (d) forming an insulating film pattern by etching the protecting film and the insulating film with the resist pattern used as a mask; and (e) etching the underlying layer with the resist pattern and the insulating film pattern used as a mask.

In this method, since an impurity can be prevented from spreading upward from the insulating film by the protecting film, a reaction product can be prevented from being produced in etching the insulating film and the protecting film. Accordingly, the growth of a deposition in the vicinity of the interface between the resist pattern and the insulating film pattern can be suppressed, and hence, the resultant electronic device includes few pattern defects caused in an underlying layer pattern formed from the underlying layer.

In the sixth method of manufacturing an electronic device, when the insulating film is a silicon nitride film, the protecting film can be an oxide film formed by oxidizing a surface portion of the insulating film in the step (b).

BRIEF DESCRIPTION OF THE DRAWINGS

FIG. 11 is a graph for showing the relationship between time of an electron beam irradiation conducted after etching the silicon nitride film and the number of pattern defects caused in a polysilicon pattern in Embodiment 7;

FIG. 21 is a graph for showing the relationship between time of an $O_2$ plasma treatment conducted after etching a silicon oxide film and the number of pattern defects caused in a metallic pattern formed by etching the metallic film in Embodiment 12;

FIG. 29 is a diagram of the relationship between time of cleaning carried out in the procedure of FIG. 28(e) and the number of pattern defects caused after forming a trench for showing comparison between cleaning with water alone and neutralization cleaning with TMAH.

DETAILED DESCRIPTION OF THE INVENTION

Now, preferred embodiments of a method of manufacturing an electronic device according to the invention will be described with reference to the accompanying drawings.

Embodiment 1

A method of manufacturing an electronic device, that is, a semiconductor device, according to Embodiment 1 will be described referring to FIGS. 1(a) through 1(d), 2 and 3. FIGS. 1(a) through 1(d) are sectional views for showing procedures for patterning a silicon nitride film and a polysilicon film in this embodiment. In this embodiment and following other embodiments, a silicon wafer is used as a substrate, a polysilicon film deposited on the substrate is formed into a gate electrode of a MOS transistor, a polysilicon line, an electrode (lower electrode) of a capacitance device, a resistor of a resistor device or the like, and a silicon nitride film deposited on the polysilicon film is formed into a surface protecting film.

Figure 1A:
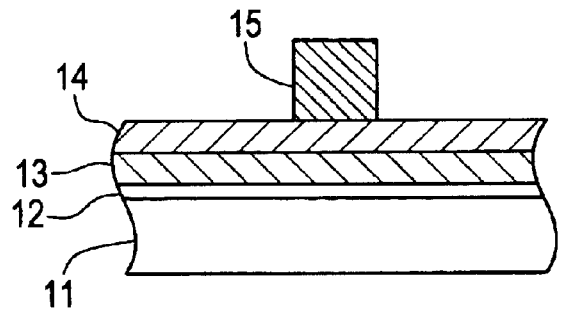
FIGS. 1(a) through 1(d) are sectional views for showing procedures in pattern formation of a silicon nitride film and a polysilicon film in Embodiments 1 through 7 according to the invention.

First, in the procedure shown in FIG. 1(a), a gate oxide film 12 with a thickness of, for example, 10 nm is formed on a silicon substrate 11 in a chamber, and a polysilicon film 13 with a thickness of 100 nm and a silicon nitride film 14 with a thickness of 150 nm are successively deposited on the gate oxide film 12 by low pressure CVD (chemical vapor deposition). Then, the silicon nitride film 14 is coated with a chemically amplified resist to form a resist film, which is formed into a resist mask 15 with a thickness of 0.7 μm by lithography using KrF excimer laser. In this procedure, the silicon nitride film 14 is formed under conditions of, for example, a flow of a $N_2$ gas of 50 sccm, a flow of a $NH_3$ gas of 600 sccm, a flow of a $SiH_2Cl_2$ gas of 60 sccm, a gas pressure of 40 Pa and a temperature of 760° C.

Figure 1B:
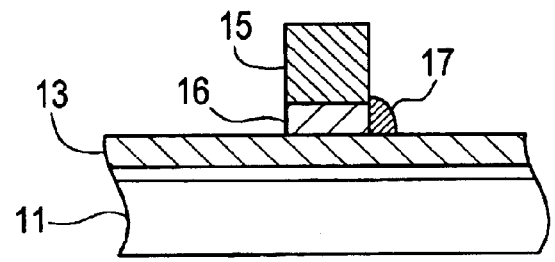

Next, in the procedure shown in FIG. 1(b), by using the resist mask 15 as an etching mask, the silicon nitride film 14 is dry etched with an etching gas serving as a dry etcher introduced into the chamber. In this manner, a surface protecting film (hard mask) 16 is formed from the silicon nitride film. In this case, the etching is conducted with a general parallel plate reactive ion etching system by using $CHF_3$ and $O_2$ as reaction gases at a flow of 100 and 10 sccm, respectively at a gas pressure of 100 Pa with RF power of 400 W. After this etching, a deposition 17 is locally grown as a contaminant in the vicinity of the interface between the resist mask 15 and the surface protecting film 16.

The deposition 17 is locally grown probably because a $NH_3$-containing material released in forming the silicon nitride film 14 by the low pressure CVD reacts with F included in a Teflon-containing material produced from the etching gas. Therefore, the deposition 17 is regarded as an ammonium fluoride ($NH_4F$) compound or a hydrazine ($N_2H_4$) compound such as hydrazine fluoride ($N_2H_5F$). It is found that such compounds have deliquescence and comparatively unstably exist.

Figure 1C:
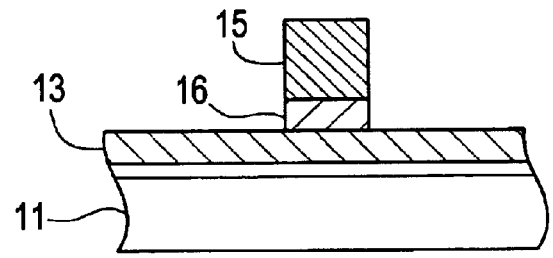

Then, in the procedure shown in FIG. 1(c), the substrate bearing the resist mask 15 is cleaned with pure water at room temperature. In this embodiment, the substrate is once exposed to the air and then cleaned. It is found that the deposition 17 can be removed without removing the resist mask 15 through the cleaning with pure water. As a result, the resist mask 15 and the surface protecting film 16 cleaned with pure water remain on the substrate.

Figure 1D:
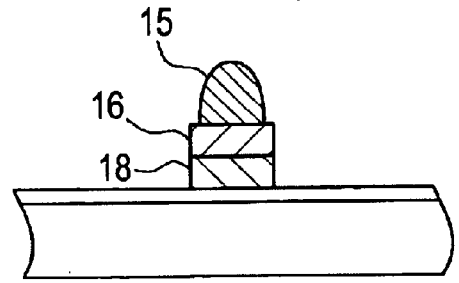

Next, in the procedure shown in FIG. 1(d), by using the resist mask 15 and the surface protecting film 16 as an etching mask, the polysilicon film 13 is dry etched by using a dry etcher, thereby forming a polysilicon pattern 18. This etching is conducted with a general parallel plate reactive ion etching system by using, for example, HBr and $O_2$ as reaction gases at a flow of 60 and 2 sccm, respectively at a gas pressure of 10 Pa with RF power of 250 W.

As the characteristic of the method of manufacturing an electronic device of this embodiment, the deposition 17 grown after etching the silicon nitride film 14 is removed by the cleaning with pure water, leaving the resist mask 15 on the substrate. In this manner, the occurrence of pattern defects in the polysilicon pattern 18 derived from the presence of the deposition 17 can be suppressed.

Moreover, in this embodiment, the relationship between time of the cleaning and the number of pattern defects is obtained by conducting the cleaning for different time durations.

Figure 2:
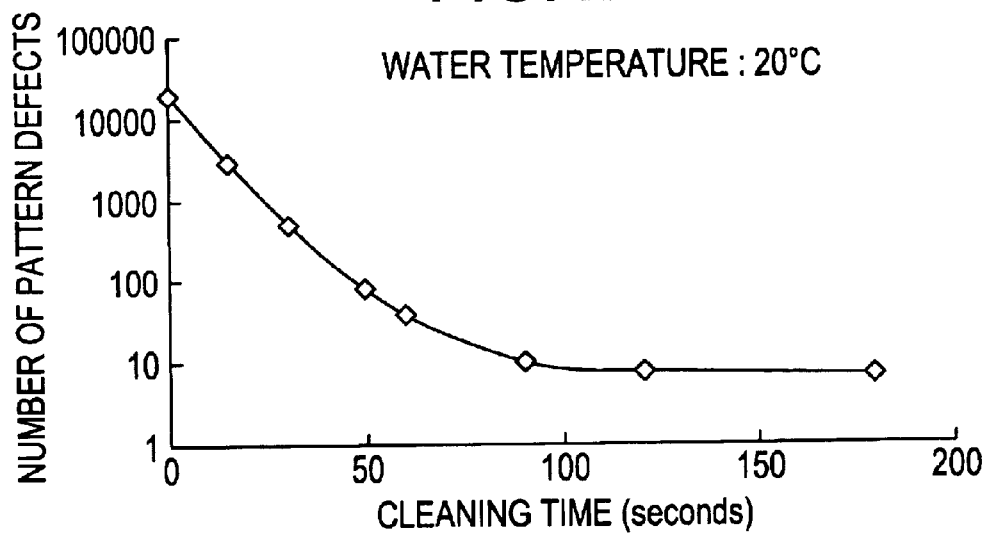
FIG. 2 is a graph for showing the relationship between time of cleaning conducted after etching the silicon nitride film and the number of pattern defects caused in a polysilicon pattern in Embodiment 1.

FIG. 2 is a graph for showing the relationship between the time of the cleaning conducted after etching the silicon nitride film 14 and the number of pattern defects caused in the polysilicon pattern 18. In FIG. 2, the abscissa indicates the time of the cleaning (in seconds) and the ordinate indicates the number of pattern defects. In this embodiment, pure water at 20° C. is used for cleaning the substrate. As is shown in FIG. 2, as the time of the cleaning is longer, the number of pattern defects caused in the polysilicon pattern 18 formed by etching the polysilicon film 13 is smaller. This means that the deposition 17 is removed by using pure water. The allowable number of pattern defects depends upon the type of devices and is approximately 50 in general.

Figure 3:
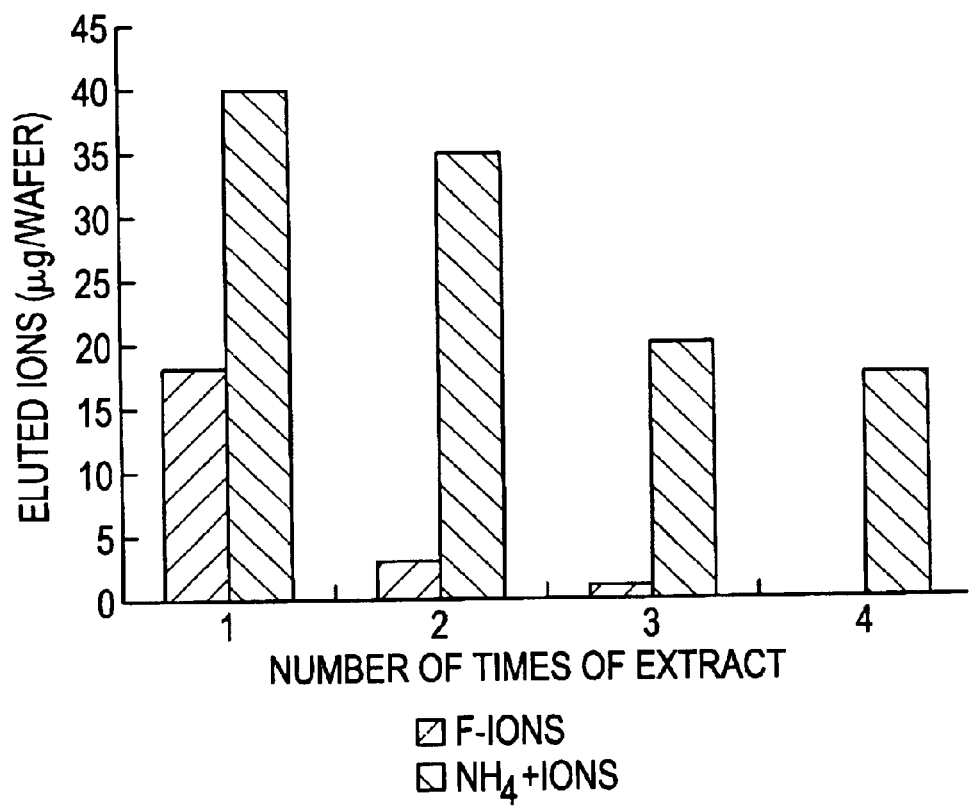
FIG. 3 is a graph for showing the result of analysis, using ion exchange chromatography, of a silicon substrate obtained after etching the silicon nitride film in Embodiment 1.

FIG. 3 is a graph for showing the result of an analysis using ion exchange chromatography of the substrate obtained after etching the silicon nitride film 14. In the analysis, ion extract using the ion exchange chromatography for 30 minutes is carried out four times by using pure water at 60° C., so as to detect $F^-$ ions and $NH_{4+}$ ions. As is shown in FIG. 3, the amount of eluted $F^-$ ions is decreased as the extract is repeated, and almost no $F^-$ ions are detected in the fourth extract. Also, the amount of eluted $NH_4^+$ ions is gradually decreased through the repeated extract. On the basis of this result, it is understood that a water-soluble ammonium fluoride ($NH_4F$)-containing reaction product is removed by cleaning the deposition with pure water. Since no $F^-$ ion is detected on the substrate prior to the etching of the silicon nitride film 14, the $F^-$ ions seem to be a component supplied by the etching gas used in etching the silicon nitride film 14. On the other hand, since $NH_4^+$ ions are detected on the substrate also prior to the etching of the silicon nitride film 14, the $NH_4^+$ ions seem to be derived from $NH_3$ that corresponds to a material gas used in depositing the silicon nitride film 14 by the CVD, is incorporated into the silicon nitride film 14 and is eluted as the ions.

As described above, according to this embodiment, the deposition 17 grown in the vicinity of the interface between the resist mask 15 and the surface protecting film 16 can be removed by cleaning the substrate with pure water without removing the resist film 15 after etching the silicon nitride film 14. Accordingly, the occurrence of pattern defects caused in the polysilicon pattern 18 formed by etching the polysilicon film 13 can be suppressed. In addition, as the time of the cleaning with pure water is longer, the number of pattern defects can be more effectively decreased.

A fine pattern has not been conventionally formed by continuously etching stacked films of a silicon nitride film and a polysilicon film, and hence, it has not been reported that a deposition or a contaminant is produced from an impurity released from the silicon nitride film. In contrast, it is well known that a contaminant is produced from a reaction product (such as $SiBr_4$ and $SiO_2$ materials) in etching a polysilicon film. However, such a contaminant has a size of 0.3 μm or more and seems to be easily found because it is more than ten times as large as a contaminant produced in etching the silicon nitride film 14 in this embodiment.

Furthermore, in a device manufactured by a pattern rule of approximately 0.35 μm or more, a contaminant with a size of 0.03 μm or less is conventionally completely negligible because even when the contaminant causes a pattern defect, such a defect cannot be a killer (a defect resulting in decreasing the yield). However, the pattern rule has recently become stricter and stricter, and in the pattern rule of 0.25 μm, even a contaminant with a size of 0.03 μm or less cannot be ignored. In other words, according to this embodiment, pattern defects caused in a polysilicon member can be suppressed also in a refined semiconductor device.

Embodiment 2

A method of manufacturing an electronic device (semiconductor device) according to Embodiment 2 of the invention will now be described with reference to FIGS. 1(a) through 1(d) and 4.

Also in this embodiment, a substrate is subjected to the apparently same procedures as those shown in FIGS. 1(a) through 1(d). A difference of this embodiment from Embodiment 1 is the conditions for the cleaning for removing a deposition 17 in the procedure for removing the deposition 17 shown in FIG. 1(c). In this embodiment, the temperature of pure water used for cleaning the substrate, namely, the cleaning temperature, is variously changed. Through this cleaning, the deposition 17 is removed, resulting in leaving a resist mask 15 and a surface protecting film 16 cleaned with pure water on a silicon substrate 11.

Thereafter, in the procedure shown in FIG. 1(d), by using the resist mask 15 and the surface protecting film 16 as an etching mask, a polysilicon film 13 is dry etched by using a dry etcher under the same conditions as in Embodiment 1, thereby forming a polysilicon pattern 18.

As a characteristic of the method of manufacturing an electronic device of this embodiment, the deposition 17 grown after etching a silicon nitride film 14 is removed through the cleaning with pure water having an increased temperature in the procedures of FIGS. 1(b) and (c) described in Embodiment 1. As a result, the occurrence of pattern defects in the polysilicon pattern 18 derived from the presence of the deposition 17 can be suppressed.

Furthermore, in this embodiment, an experiment is made with variously changing the temperature of the pure water, namely, the cleaning temperature, so as to find the relationship between the cleaning temperature and the number of pattern defects.

Figure 4:
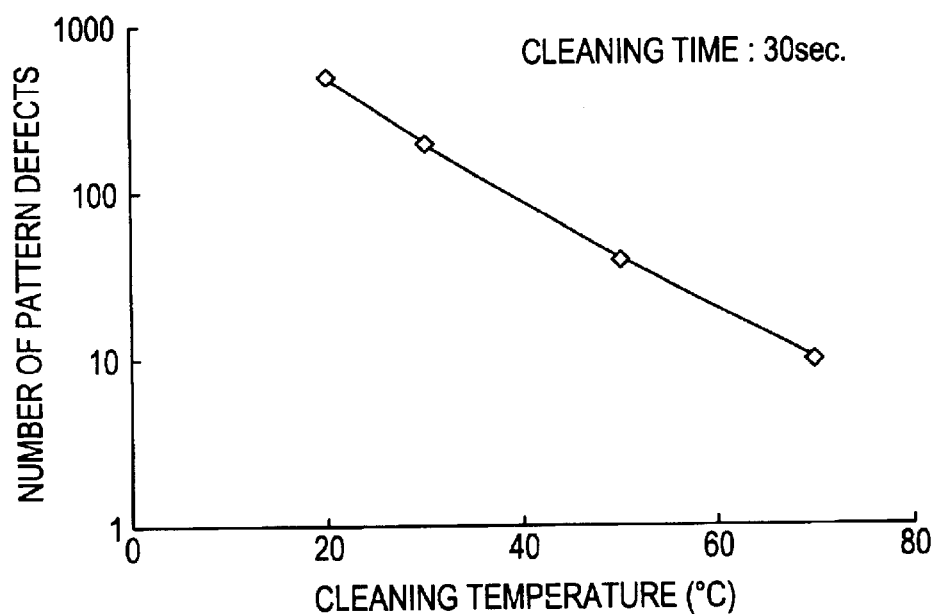
FIG. 4 is a graph for showing the relationship between the temperature of cleaning conducted after etching the silicon nitride film and the number of pattern defects caused in a polysilicon pattern in Embodiment 2.

FIG. 4 is a graph for showing the relationship between the cleaning temperature adopted in removing the deposition 17 after etching the silicon nitride film 14 and the number of pattern defects caused in the polysilicon pattern 18. In FIG. 4, the abscissa indicates the cleaning temperature (in ° C.), and the ordinate indicates the number of pattern defects. In the experiment, the substrate is cleaned for 30 seconds with pure water. As is shown in FIG. 4, as the cleaning temperature increases, the number of pattern defects caused in the polysilicon pattern 18 decreases. This means that the deposition 17 is removed by using pure water and that the deposition 17 can be more effectively removed with pure water having a higher temperature.

In this manner, according to this embodiment, the deposition 17 grown in the vicinity of the interface between the resist mask 15 and the surface protecting film 16 can be removed by cleaning the substrate with pure water having an increased temperature after etching the silicon nitride film 14. Accordingly, the occurrence of pattern defects in the polysilicon pattern 18 formed by etching the polysilicon film 13 can be suppressed. In addition, when the temperature of the pure water is increased to, for example, 50° C. and 70° C., the number of pattern defects can be more effectively decreased.

Embodiment 3

A method of manufacturing an electronic device (semiconductor device) according to Embodiment 3 of the invention will now be described with reference to FIGS. 1(a) through 1(d) and 5.

Also in this embodiment, a substrate is subjected to the apparently same procedures as those shown in FIGS. 1(a) through 1(d). A difference of this embodiment from Embodiment 1 is the kind of cleaning solution used in the cleaning for removing a deposition 17 in the procedure for removing the deposition 17 shown in FIG. 1(c). In this embodiment, the substrate is cleaned not with pure water but with a diluted hydrofluoric acid aqueous solution. In this case, in addition to the function of cleaning with water to remove the deposition 17, a function of diluted hydrofluoric acid to neutralize an alkaline $NH_3$ component included in the deposition 17 can be exhibited for removing the deposition 17. Through this cleaning, the deposition 17 is removed, resulting in leaving a resist mask 15 and a surface protecting film 16 cleaned with diluted hydrofluoric acid on a silicon substrate 11.

Thereafter, in the procedure shown in FIG. 1(d), by using the resist mask 15 and the surface protecting film 16 as an etching mask, a polysilicon film 13 is dry etched by using a dry etcher under the same conditions as in Embodiment 1, thereby forming a polysilicon pattern 18.

As a characteristic of the method of manufacturing an electronic device of this embodiment, the deposition 17 grown in the vicinity of the interface between the resist mask 15 and the surface protecting film 16 is removed through the cleaning accompanied with neutralization (hereinafter referred to as neutralization cleaning) with diluted hydrofluoric acid in the procedures shown in FIGS. 1(b) and 1(c). In this manner, the occurrence of pattern defects in the polysilicon pattern 18 formed by etching the polysilicon film 13 can be suppressed.

Figure 5:
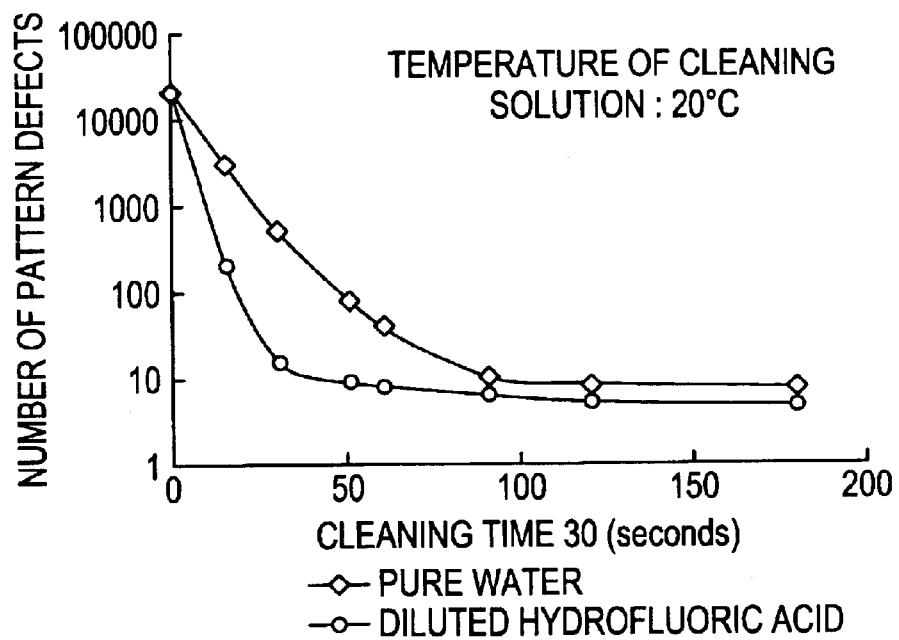
FIG. 5 is a graph for showing the relationship between type of used cleaning solutions and time of cleaning conducted after etching the silicon nitride film and the number of pattern defects caused in a polysilicon patter in Embodiment 3.

FIG. 5 is a graph for showing the relationship between the kind of cleaning solution and the time of cleaning conducted after etching the silicon nitride film 14 and the number of pattern defects caused in the polysilicon pattern 18. In FIG. 5, the abscissa indicates the cleaning time and the ordinate indicates the number of pattern defects. In this embodiment, the cleaning with a diluted hydrofluoric acid aqueous solution is compared with the cleaning with pure water alone. At this point, the concentration of the diluted hydrofluoric acid aqueous solution is adjusted by mixing pure water ($H_2O$) and hydrofluoric acid (HF) at a ratio of 600:1, and the temperatures of diluted hydrofluoric acid and pure water are both 20° C. As is shown in FIG. 5, as compared with the cleaning with pure water alone, the number of pattern defects can be more effectively decreased through the neutralization cleaning with the diluted hydrofluoric acid aqueous solution. Also, as the time of the neutralization cleaning with the diluted hydrofluoric acid aqueous solution is longer, the number of pattern defects caused in the polysilicon pattern 18 formed by etching the polysilicon film 13 can be further decreased. This means that the deposition 17 can be more effectively removed by using diluted hydrofluoric acid.

In this manner, according to this embodiment, the deposition 17 grown in the vicinity of the interface between the resist mask 15 and the surface protecting film 16 is removed by cleaning the substrate with the diluted hydrofluoric acid aqueous solution after etching the silicon nitride film 14. Accordingly, the occurrence of pattern defects in the polysilicon pattern 18 formed by etching the polysilicon film 13 can be suppressed. In addition, also in the cleaning of the substrate with the diluted hydrofluoric acid aqueous solution, the number of pattern defects can be more effectively decreased as the cleaning time is longer.

Embodiment 4

A method of manufacturing an electronic device (semiconductor device) according to Embodiment 4 of the invention will now be described with reference to FIGS. 1(a) through 1(d), 6 and 7.

Also in this embodiment, a substrate is subjected to the apparently same procedures as those shown in FIGS. 1(a) through 1(d). A difference of this embodiment from Embodiment 1 is the content of the procedure for removing a deposition 17 shown in FIG. 1(c). In this embodiment, subsequently to the procedure of FIG. 1(b), a substrate is heated on a hot plate in the air so as to remove the deposition 17. In this manner, the deposition 17 is removed, resulting in leaving a resist mask 15 and a surface protecting film 16 having been heated in the heat treatment on the silicon substrate 11.

Thereafter, in the procedure shown in FIG. 1(d), by using the resist mask 15 and the surface protecting film 16 as an etching mask, a polysilicon film 13 is dry etched by using a dry etcher under the same conditions as in Embodiment 1, thereby forming a polysilicon pattern 18.

As a characteristic of the method of manufacturing an electronic device of this embodiment, the deposition 17 grown after etching the silicon nitride film 14 is removed by conducting a heat treatment in the air in the procedures shown in FIGS. 1(b) and 1(c) described in Embodiment 1. As a result, the occurrence of pattern defects in the polysilicon pattern 18 derived from the presence of the deposition 17 can be suppressed.

Figure 6:
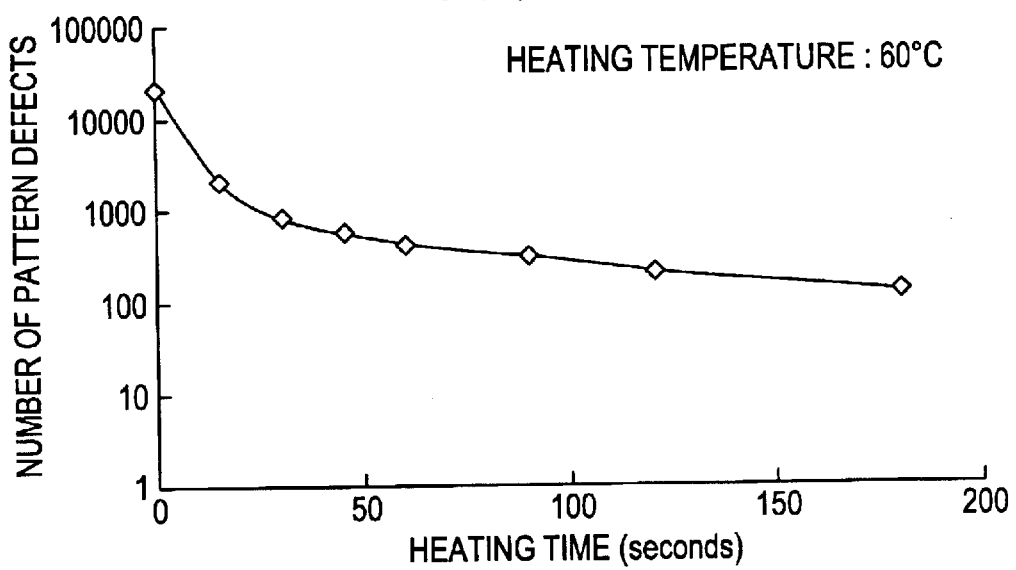
FIG. 6 is a graph for showing the relationship between time of a heat treatment conducted after etching the silicon nitride film and the number of pattern defects caused in a polysilicon pattern in Embodiment 4.

FIG. 6 is a graph for showing the relationship between the time of the heat treatment conducted after etching the silicon nitride film 14 and the number of pattern defects caused in the polysilicon pattern 18. In FIG. 6, the abscissa indicates the heating time (in seconds) and the ordinate indicates the number of pattern defects. In this embodiment, the substrate is heated at 60° C. with the hot plate. As is shown in FIG. 6, as the heating time with the hot plate is elongated to, for example, 30, 60, 90 and 120 seconds, the number of pattern defects caused in the polysilicon pattern 18 formed by etching the polysilicon film 13 is decreased. This means that the deposition 17 is removed through the heat treatment and that the deposition 17 can be more effectively removed as the heating time is longer.

Figure 7:
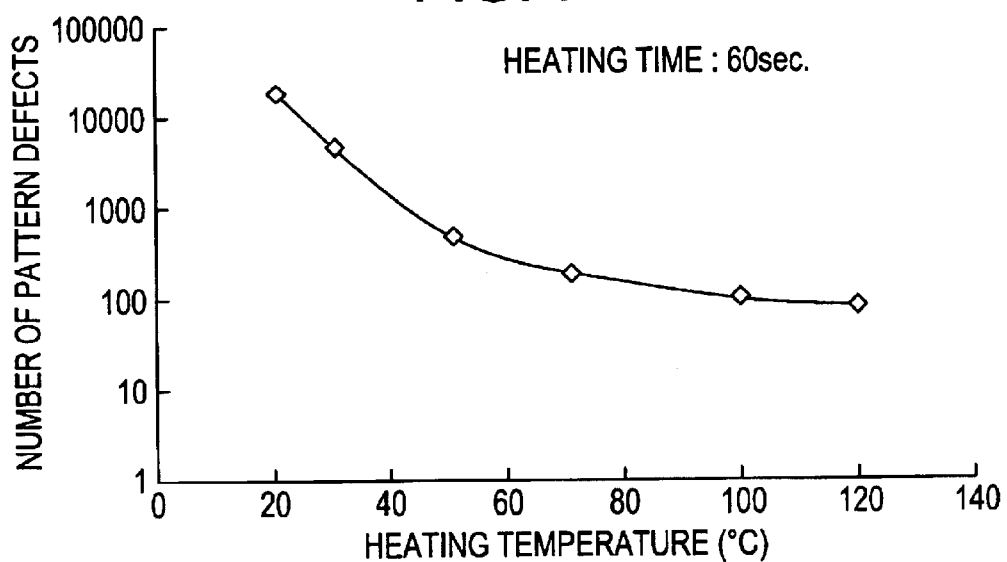
FIG. 7 is a graph for showing the relationship between the temperature of the heat treatment conducted after etching the silicon nitride film and the number of pattern defects caused in the polysilicon pattern in Embodiment 4.

FIG. 7 is a graph for showing the relationship between the heating temperature in the heat treatment conducted after etching the silicon nitride film 14 and the number of pattern defects caused in the polysilicon pattern 18. In FIG. 7, the abscissa indicates the heating temperature (in ° C.) and the ordinate indicates the number of pattern defects. In this case, the substrate is heated for 60 seconds with the hot plate. As is shown in FIG. 7, as the heating temperature with the hot plate is increased to, for example, 30, 50, 70 and 100° C., the number of pattern defects caused after etching the polysilicon film 13, namely, the number of pattern defects caused in the polysilicon pattern 18, is decreased. This means that the deposition 17 is removed through the heat treatment, and that the deposition 17 can be more effectively removed as the heating temperature is higher. However, it is not preferable that the substrate is heated to a temperature where the resist mask 15 is heated at a temperature exceeding the resistible temperature of a resist material included in the resist mask 15. A resist material generally used has a resistible temperature of approximately 110° C. through 120° C.

Figure 8:
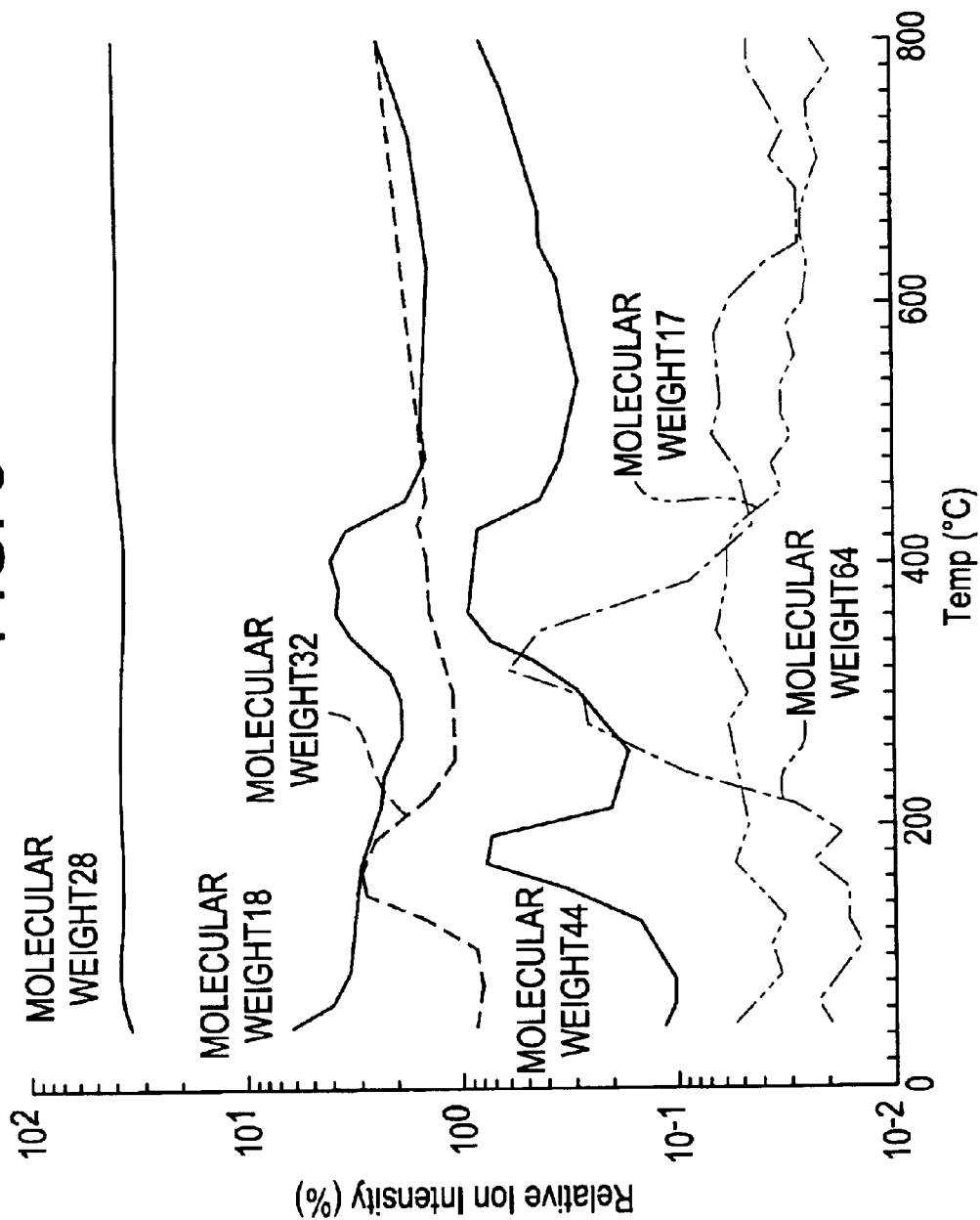
FIG. 8 is a graph for showing the result of an analysis using TDS of a silicon substrate obtained after etching the silicon nitride film in Embodiment 4.

FIG. 8 shows the result of an analysis using TDS (thermal desorption spectroscopy) of the substrate obtained after etching the silicon nitride film 14. In FIG. 8, the abscissa indicates the temperature (in ° C.) and the ordinate indicates the relative ion intensity (in %).

As a result of analyzing the data shown in FIG. 8, a substance with a molecular weight of 28 seems to correspond to nitrogen ($N_2$) used as a carrier gas for the TDS and carbon monoxide (CO) included in the substrate, and a substance with a molecular weight of 18 seems to correspond to water ($H_2O$) or ammonium ions ($NH_4^+$) produced from the resist mask 15 and the silicon nitride film 14.

Also, a substance with a molecular weight of 44 having a peak region with high relative ion intensity in the temperature range between 120° C. and 200° C. seems to correspond to carbon dioxide ($CO_2$), a substance with a molecular weight of 64 having a peak region with high relative ion intensity in the temperature range between 200° C. and 400° C. seems to correspond to sulfur dioxide ($SO_2$), and these substances are regarded to be produced through decomposition of the resist mask 15.

Furthermore, ammonia ($NH_3$) corresponding to a substance with a molecular weight of 17 has a broad peak region in the temperature range between 100° C. and 450° C. Also, a substance with a molecular weight of 32 having a peak region in the temperature range between 120° C. and 200° C. seems to correspond to hydrazine ($N_2H_4$) and oxygen ($O_2$).

In this manner, it is understood, on the basis of the data of the TDS shown in FIG. 8, that the deposition 17 including the ammonia compounds such as ammonia ($NH_3$) and hydrazine ($N_2H_4$) and reaction products such as water ($H_2O$) and oxygen ($O_2$) is removed by heating the substrate.

Also, on the basis of the data of the TDS shown in FIG. 8, degas is observed in the range of the temperature of the analysis between room temperature and 800° C. However, in consideration of the heat resistance of the resist material included in the resist mask 15, the heat treatment is preferably conducted as annealing at approximately 110 through 120° C. Therefore, the number of pattern defects can be decreased without harmfully affecting the resist mask 15 with the heating time elongated as is shown in FIG. 6 and the heating temperature increased in the range up to 120° C. as is shown in FIG. 7.

In this manner, according to this embodiment, the deposition 17 grown in the vicinity of the interface between the resist mask 15 and the surface protecting film 16 is removed by heating the substrate after etching the silicon nitride film 14. Accordingly, the occurrence of pattern defects in the polysilicon pattern 18 formed by etching the polysilicon film 13 can be suppressed. At this point, the number of pattern defects can be more effectively decreased as the heating time is longer and the heating temperature is higher.

Embodiment 5

A method of manufacturing an electronic device (semiconductor device) according to Embodiment 5 of the invention will now be described with reference to FIGS. 1(*a*) through 1(*d*) and 9. Also in this embodiment, a substrate is subjected to the apparently same procedures as those shown in FIGS. 1(*a*) through 1(*d*). In this embodiment, the substrate is kept in vacuum without being exposed to the air to be continuously heated after the procedure shown in FIG. 1(*b*) described in Embodiment 1. In this embodiment, a multi-chamber etching system (not shown) equipped with an etching chamber where a silicon nitride film 14 and a silicon substrate 11 can be etched and a heating chamber is used. Since this system is used, the substrate can be kept in vacuum without being exposed to the air, and hence, a bare portion on the substrate can be prevented from absorbing a water component in the air between the procedure of FIG. 1(*b*) and the procedure of FIG. 1(*c*). Accordingly, the deposition 17 can be suppressed from growing after etching the silicon nitride film 14. Also, the grown deposition 17 is removed by the heat treatment. In this manner, the deposition 17 is removed, resulting in leaving a resist mask 15 and a surface protecting film 16 having been heated in the heat treatment under vacuum on the silicon substrate 11.

Thereafter, in the procedure shown in FIG. 1(*d*), by using the resist mask 15 and the surface protecting film 16 as an etching mask, a polysilicon film 13 is dry etched by using a dry etcher under the same conditions as in Embodiment 1, thereby forming a polysilicon pattern 18.

As a characteristic of the method of manufacturing an electronic device of this embodiment, the deposition 17 is removed with the growth thereof suppressed after etching the silicon nitride film 14 by heating and keeping the substrate in vacuum immediately after the etching in the procedures shown in FIGS. 1(*b*) and 1(*c*). As a result, the occurrence of pattern defects in the polysilicon pattern 18 derived from the presence of the deposition 17 can be suppressed.

Figure 9:
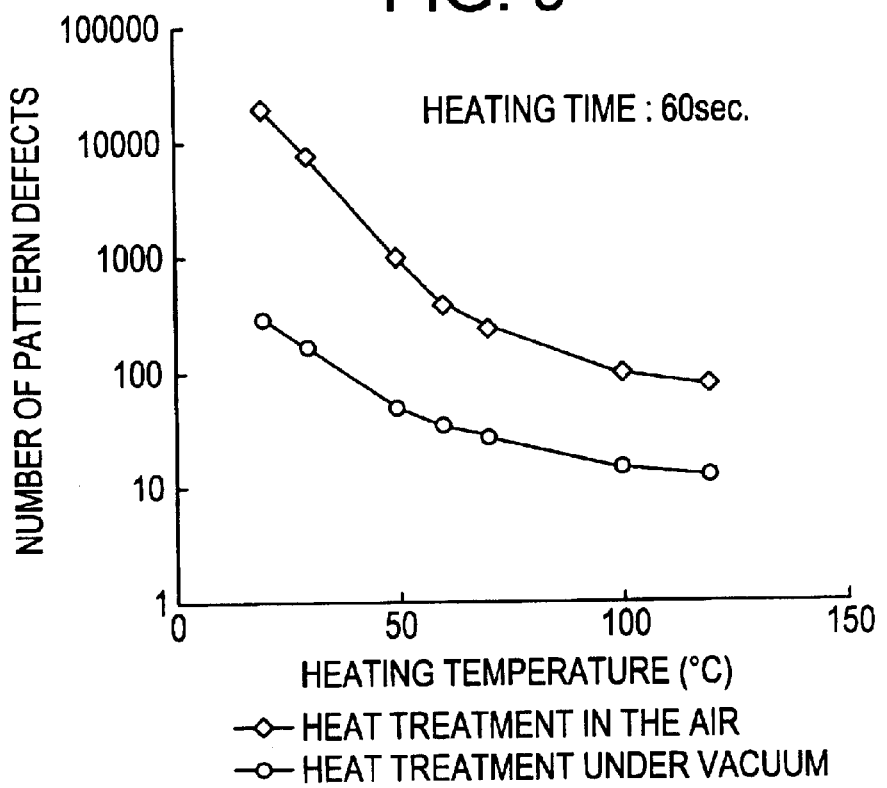
FIG. 9 is a graph for showing the relationship between the temperatures in heat treatments conducted in the air and in vacuum after etching the silicon nitride film and the number of pattern defects caused in a polysilicon pattern in Embodiment 5.

FIG. 9 is a graph for showing the relationship between the heating temperatures of heat treatments conducted in the air and under vacuum after etching the silicon nitride film 14 and the number of pattern defects caused in the polysilicon pattern 18. In FIG. 9, the abscissa indicates the heating temperature (in ° C.) and the ordinate indicates the number of pattern defects. In this embodiment, the heating time is 60 seconds both in the air and under vacuum. As is shown in FIG. 9, in the both heat treatments conducted in the air and under vacuum, as the heating temperature is increased to, for example, 50, 60, 70 and 100° C., the number of pattern defects caused in the polysilicon pattern 18 is decreased. Also, when the heat treatment is continuously conducted under vacuum, the number of pattern defects can be largely decreased as compared with the case where the heat treatment is conducted in the air because the influence of a water component on the substrate can be suppressed under vacuum. This means that the growth of the deposition 17 can be suppressed and the grown deposition 17 can be effectively removed by the heat treatment conducted under vacuum.

In this manner, according to this embodiment, the deposition 17 can be suppressed from growing in the vicinity of the interface between the resist mask 15 and the surface protecting film 16 and the grown deposition 17 can be removed by heating the substrate under vacuum subsequently to the etching of the silicon nitride film 14. Accordingly, the occurrence of pattern defects in the polysilicon pattern 18 formed by etching the polysilicon film 13 can be suppressed. At this point, the number of pattern defects can be more effectively decreased as the heating temperature is higher. Also, similarly to Embodiment 4, it is confirmed that the number of pattern defects can be more effectively decreased as the heating time is longer.

Embodiment 6

A method of manufacturing an electronic device (semiconductor device) according to Embodiment 6 of the invention will now be described with reference to FIGS. 1(*a*) through 1(*d*) and 10. Also in this embodiment, a substrate is subjected to the apparently same procedures as those shown in FIGS. 1(*a*) through 1(*d*). In this embodiment, a deposition 17 is removed by conducting a $N_2$ plasma treatment after the procedure shown in FIG. 1(*b*) described in Embodiment 1. In this embodiment, the $N_2$ plasma treatment is conducted with a general parallel plate reactive ion etching system under conditions of, for example, a flow of a $N_2$ gas of 10 sccm, a gas pressure of 50 mTorr, RF power of 200W and a substrate temperature of 30° C. In this manner, a resist mask 15 and a surface protecting film 16 having been treated with the $N_2$ plasma remain on a silicon substrate 11.

Thereafter, in the procedure shown in FIG. 1(d), by using the resist mask 15 and the surface protecting film 16 as an etching mask, a polysilicon film 13 is dry etched by using a dry etcher under the same conditions as in Embodiment 1, thereby forming a polysilicon pattern 18.

As a characteristic of the method of manufacturing an electronic device of this embodiment, the deposition 17 grown after etching the silicon nitride film 14 is removed by conducting the $N_2$ plasma treatment on the substrate after etching the silicon nitride film 14 in the procedures shown in FIGS. 1(b) and 1(c). As a result, the occurrence of pattern defects in the polysilicon pattern 18 derived from the presence of the deposition 17 can be suppressed.

Figure 10:
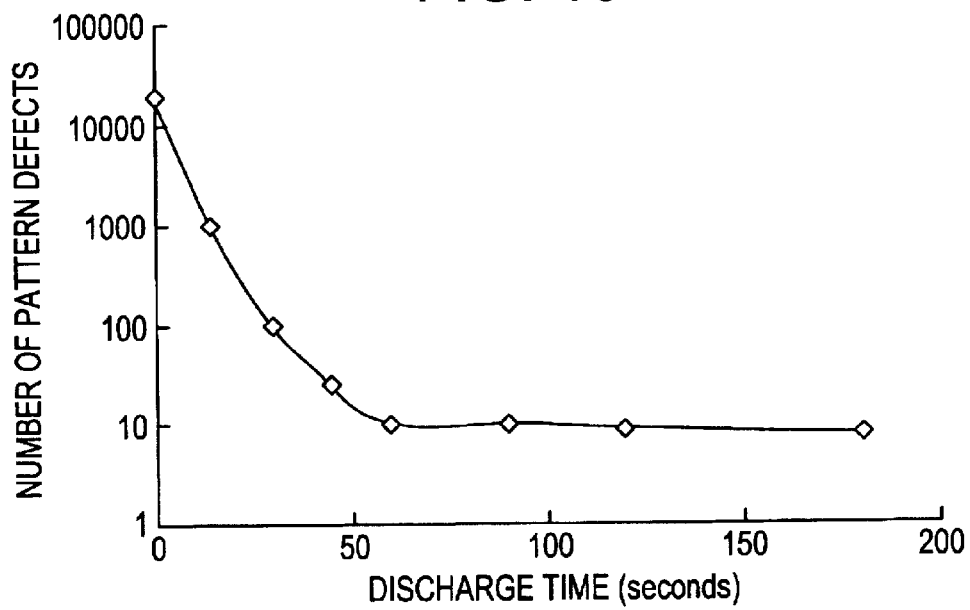
FIG. 10 is a graph for showing the relationship between a discharge time of a $N_2$ plasma treatment conducted after etching the silicon nitride film and the number of pattern defects caused in a polysilicon pattern in Embodiment 6.

FIG. 10 is a graph for showing the relationship between the discharging time in the $N_2$ plasma treatment conducted after etching the silicon nitride film 14 and the number of pattern defects caused in the polysilicon pattern 18. In FIG. 10, the abscissa indicates the discharging time (in seconds) and the ordinate indicates the number of pattern defects. As is shown in FIG. 10, as the discharging time in the $N_2$ plasma treatment is increased to, for example, 30, 40, 60 and 90 seconds, the number of pattern defects caused in the polysilicon pattern 18 is decreased. This means that the deposition 17 can be easily removed by the $N_2$ plasma treatment and that the deposition 17 can be more effectively removed as the discharging time is longer.

In this manner, according to this embodiment, the deposition 17 grown in the vicinity of the interface between the resist mask 15 and the surface protecting film 16 is removed by conducting the $N_2$ plasma treatment on the substrate after etching the silicon nitride film 14. Accordingly, the occurrence of pattern defects in the polysilicon pattern 18 formed by etching the polysilicon film 13 can be suppressed. In addition, the number of pattern defects can be more effectively decreased as the discharging time is longer.

Although the $N_2$ gas is used in the plasma treatment in this embodiment, it goes without saying that the same effect can be attained when $O_2$ or any other inert gas such as Ar that does not affect the etching characteristic is used.

Embodiment 7

A method of manufacturing an electronic device (semiconductor device) according to Embodiment 7 of the invention will now be described with reference to FIGS. 1(a) through 1(d) and 11.

Also in this embodiment, a substrate is subjected to the apparently same procedures as those shown in FIGS. 1(a) through 1(d). In this embodiment, a deposition 17 is removed by irradiating a substrate with an electron beam serving as a charged particle beam after the procedure shown in FIG. 1(b). In this embodiment, the substrate is irradiated with the electron beam by using a general electron microscope under conditions of a substrate temperature of 25° C. and a beam current of 5 pA/$\mu$m$^2$. In this manner, a resist mask 15 and a surface protecting film 16 having been irradiated with the electron beam remain on the silicon substrate 11.

Thereafter, in the procedure shown in FIG. 1(d), by using the resist mask 15 and the surface protecting film 16 as an etching mask, a polysilicon film 13 is dry etched by using a dry etcher under the same conditions as in Embodiment 1, thereby forming a polysilicon pattern 18.

As a characteristic of the method of manufacturing an electronic device of this embodiment, the deposition 17 grown after etching the silicon nitride film 14 is removed by irradiating the substrate with an electron beam after etching the silicon nitride film 14 in the procedures shown in FIGS. 1(b) and 1(c). As a result, the occurrence of pattern defects in the polysilicon pattern 18 derived from the presence of the deposition 17 can be suppressed.

FIG. 11 is a graph for showing the relationship between the time of the electron beam irradiation conducted after etching the silicon nitride film 14 and the number of pattern defects caused in the polysilicon pattern 18. In FIG. 11, the abscissa indicates the time (in seconds) of irradiation with the electron beam and the ordinate indicates the number of pattern defects. As is shown in FIG. 11, as the time of irradiation with the electron beam is increased to, for example, 30, 40, 60 and 90 seconds, the number of pattern defects caused after etching the polysilicon film 13, namely, the number of pattern defects caused in the polysilicon pattern 18, is decreased. This means that the deposition 17 is removed through irradiation with the electron beam, and that the deposition 17 can be more effectively removed as the irradiation time is longer.

In this manner, according to this embodiment, the deposition 17 grown in the vicinity of the interface between the resist mask 15 and the surface protecting film 16 is removed by irradiating the substrate with an electron beam after etching the silicon nitride film 14. Accordingly, the occurrence of pattern defects in the polysilicon pattern 18 formed by etching the polysilicon film 13 can be suppressed. In addition, the number of pattern defects can be more effectively decreased as the irradiation time is longer.

Although the electron beam is used as the charged particle beam in this embodiment, it goes without saying that the same effect can be attained when an ion beam is used.

Embodiment 8

A method of manufacturing an electronic device, that is, a semiconductor device, according to Embodiment 8 of the invention will now be described with reference to FIGS. 12(a) through 12(d), 13 and 14. FIGS. 12(a) through 12(d) are sectional views for showing procedures from deposition of a silicon nitride film to patterning of a polysilicon film in this embodiment.

Figure 12A:
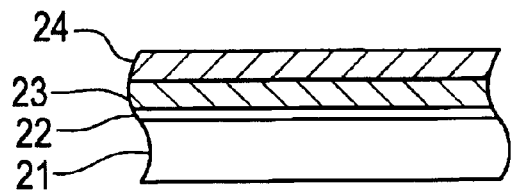
FIGS. 12(a) through 12(d) are sectional views for showing procedures in pattern formation of a silicon nitride film and a polysilicon film in Embodiment 8 of the invention.

First, in the procedure shown in FIG. 12(a), a gate oxide film 22, a polysilicon film 23 and a silicon nitride film 24 are successively deposited on a silicon substrate 21 under the same conditions as in Embodiment 1. At this point, the silicon nitride film 24 includes an ammonia material, water and the like as a residual gas, and this residual gas reacts with an etching gas and a reaction product in a subsequent procedure of dry etching, resulting in producing another reaction product. In this procedure, the formed silicon nitride film 24 is heated with an electric furnace for 30 minutes, thereby removing an impurity, that is, the residual gas, included in the silicon nitride film 24.

Figure 12B:
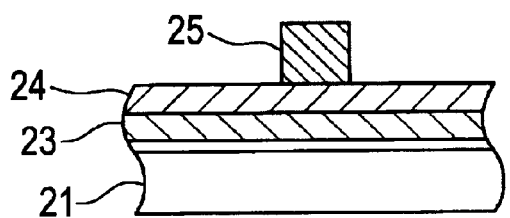

Next, in the procedure shown in FIG. 12(b), a resist mask 25 is formed in the same manner as described in Embodiment 1.

Figure 12C:
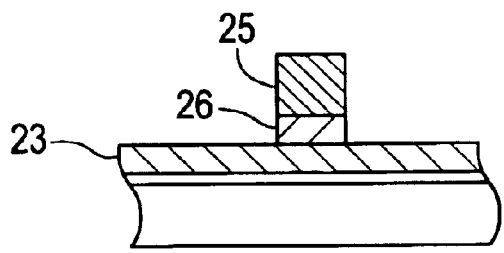

Then, in the procedure shown in FIG. 12(c), by using the resist mask 25 as an etching mask, the silicon nitride film 24 is dry etched by using a dry etcher under the same conditions as in Embodiment 1. Thus, a surface protecting film 26 is formed. At this point, since the residual gas is removed in the procedure of FIG. 12(a), a deposition as described in the aforementioned embodiments is scarcely grown after the etching.

Figure 12D:
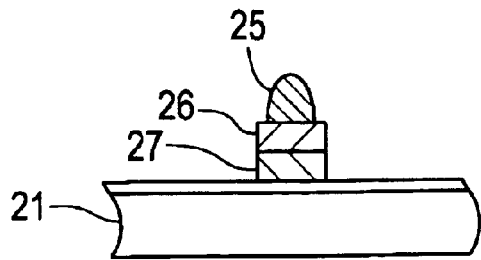

Next, in the procedure shown in FIG. 12(d), by using the resist mask 25 and the surface protecting film 26 as an etching mask, the polysilicon film 23 is dry etched by using a dry etcher under the same conditions as described in Embodiment 1, thereby forming a polysilicon pattern 27.

As a characteristic of the method of manufacturing an electronic device of this embodiment, the silicon nitride film 24 is etched after removing the residual gas included therein by heating the silicon nitride film 24. Since the silicon nitride film 24 is thus etched after removing the residual gas including the ammonia-containing material and water, a reaction product can be prevented from being produced through the reaction between the residual gas and an etching gas during the dry etching. Accordingly, the deposition made from the reaction product can be prevented from growing, and hence, the occurrence of pattern defects in the polysilicon pattern 27 formed by etching the polysilicon film 23 can be suppressed.

Figure 13:
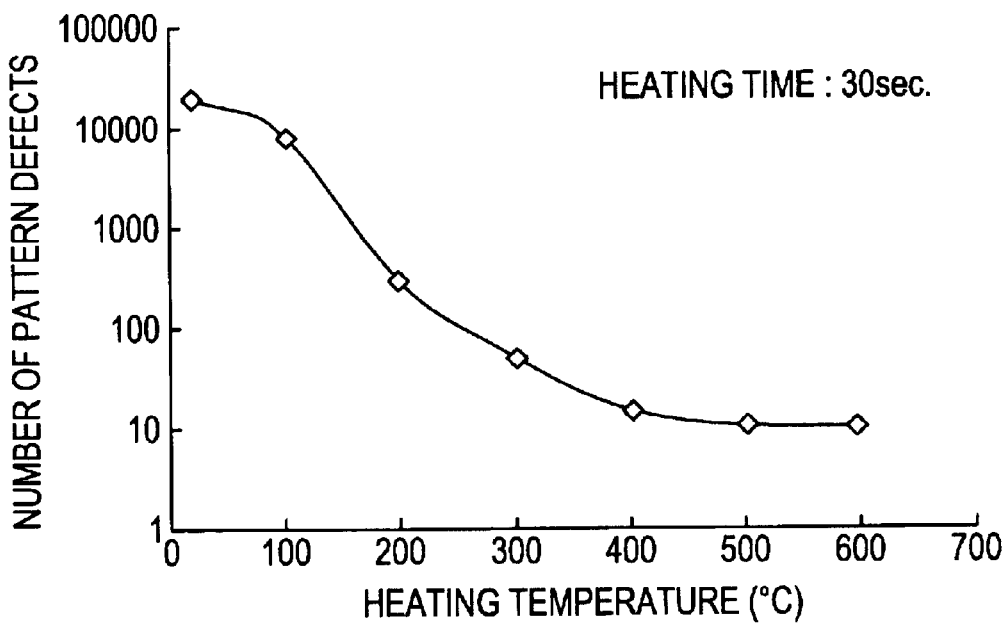
FIG. 13 is a graph for showing the relationship between the temperature of a heat treatment conducted on the silicon nitride film prior to etching and the number of pattern defects caused in a polysilicon pattern in Embodiment 8.

FIG. 13 is a graph for showing the relationship between the temperature for heating the silicon nitride film 24 before the etching and the number of pattern defects caused in the polysilicon pattern 27. In FIG. 13, the abscissa indicates the heating temperature (in ° C.) and the ordinate indicates the number of pattern defects. In this embodiment, the substrate is heated for 30 minutes with an electric furnace. As is shown in FIG. 13, as the heating temperature is increased to, for example, 200, 300, 400 and 500° C., the number of pattern defects caused in the polysilicon pattern 27 is decreased.

Figure 14:
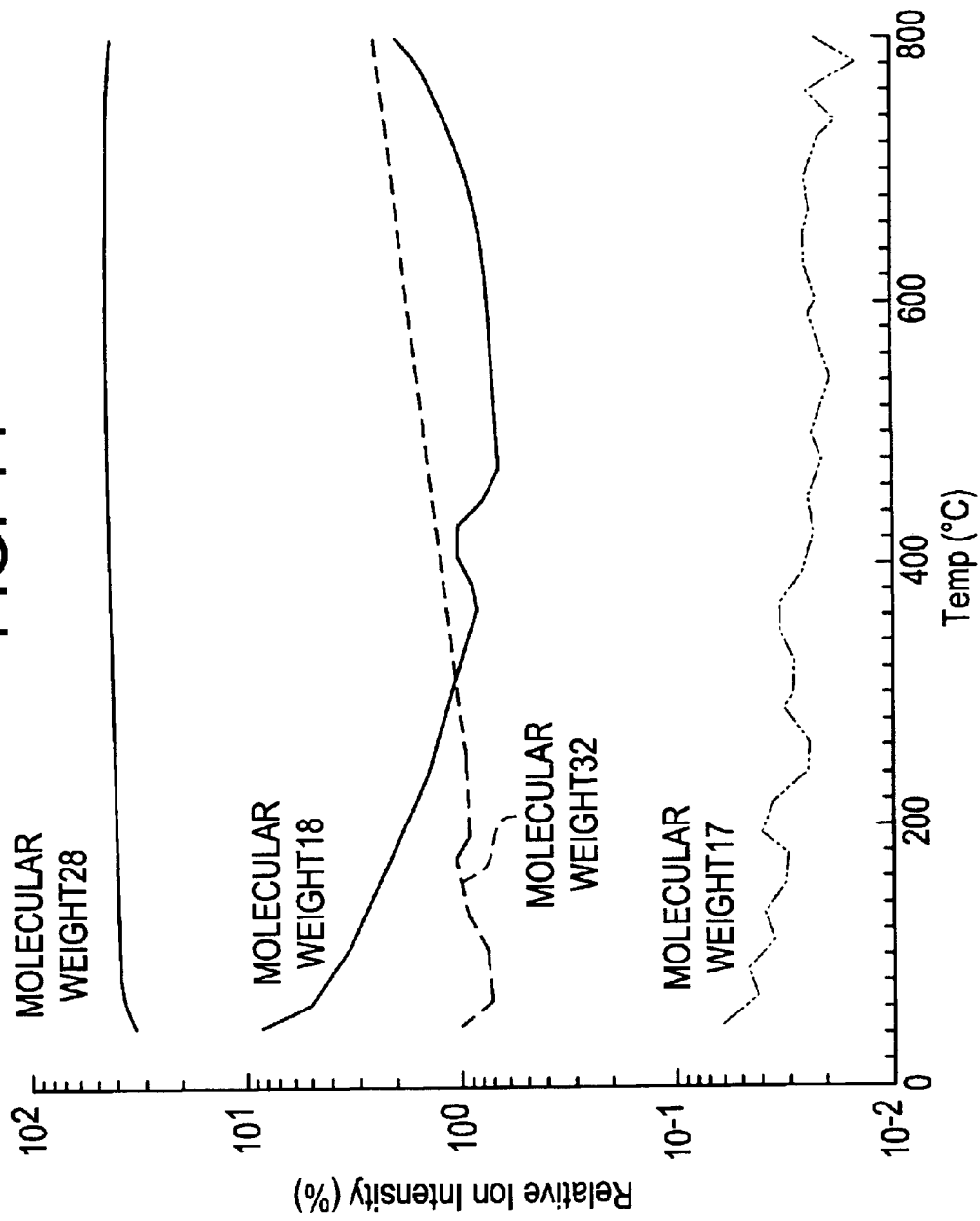
FIG. 14 is a graph for showing the result of an analysis using TDS of a silicon substrate obtained after depositing and before etching the silicon nitride film in Embodiment 8.

FIG. 14 shows the result of an analysis using TDS (thermal desorption spectroscopy) of the substrate bearing the silicon nitride film 24 not etched yet.

In FIG. 14, a substance with a molecular weight of 28 corresponds to nitrogen ($N_2$) of a carrier gas for the TDS and carbon monoxide (CO) included in the substrate. A substance with a molecular weight of 18 seems to correspond to water ($H_2O$) and ammonium ions ($NH_4^+$), which are detected in the range of temperature in the analysis between 20° C. and 800° C. and regarded to be produced from the silicon nitride film 24. A substance with a molecular weight of 17 seems to correspond to ammonia ($NH_3$), which is less dependent on the temperature, detected in the temperature range between 20° C. and 800° C. and regarded to be produced from the silicon nitride film 24.

Also, a substance with a molecular weight of 32 seems to correspond to hydrazine ($N_2H_4$) and oxygen ($O_2$). These substances are regarded to be produced through a reaction of ammonia ($NH_3$) used as a reaction gas in forming the silicon nitride film 24.

As is understood from the data of the TDS shown in FIG. 14, the silicon nitride film 24 includes compounds such as ammonia and hydrazine. Also, degas is observed in the range between room temperature and 800° C., that is, the measurement upper limit temperature. It is found that the impurities, that is, gases of ammonia ($NH_3$), hydrazine ($N_2H_4$), water ($H_2O$) and oxygen ($O_2$), can be more effectively removed when the substrate is heated at a higher temperature.

In the procedure for etching the silicon nitride film 24 shown in FIG. 12(c), these compounds easily react with halogen such as fluorine (F) included in the etching gas to produce a salt of halide, which forms the deposition. When the deposition of the salt of halide is present, pattern defects are caused in the polysilicon pattern 27 in the procedure for etching the underlying film (namely, the polysilicon film) shown in FIG. 12(d). Accordingly, when ammonia ($NH_3$), hydrazine ($N_2H_4$), water ($H_2O$) and oxygen ($O_2$) are removed by heating the substrate before etching the silicon nitride film 24, the reaction product can be prevented from being produced in the procedure for dry etching the underlying film.

In this manner, according to this embodiment, the production of the reaction product can be suppressed by heating the substrate after depositing the silicon nitride film 24. Accordingly, the occurrence of pattern defects in the polysilicon pattern 27 formed by etching the polysilicon film 23 can be suppressed. In addition, the number of pattern defects can be more effectively decreased as the heating temperature is higher.

Embodiment 9

A method of manufacturing an electronic device (semiconductor device) according to Embodiment 9 of the invention will now be described with reference to FIGS. 15(a) through 15(e) and 16. FIGS. 15(a) through 15(e) are sectional views for showing procedures from deposition of a silicon nitride film to patterning of a polysilicon film in this embodiment.

Figure 15A:
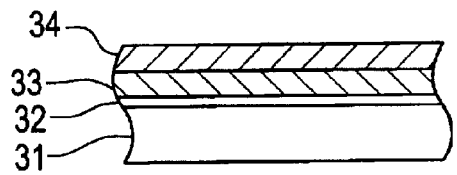
FIGS. 15(a) through 15(e) are sectional views for showing procedures in pattern formation of a silicon nitride film and a polysilicon film in Embodiments 9 and 10 of the invention.

First, in the procedure shown in FIG. 15(a), a gate oxide film 32, a polysilicon film 33 and a silicon nitride film 34 are successively deposited on a silicon substrate 31 under the same conditions as described in Embodiment 1. At this point, the silicon nitride film 34 includes a residual gas of an ammonia-containing material, and this residual gas reacts with an etching gas and a reaction product in a subsequent dry etching procedure, resulting in producing another reaction product.

Figure 15B:
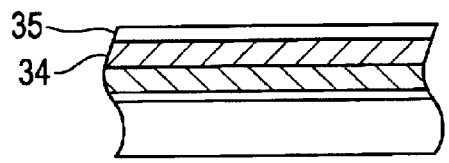

Then, in the procedure shown in FIG. 15(b), a silicon oxide film 35 is deposited on the silicon nitride film 34 by the low pressure CVD. Thus, an impurity, namely, the residual gas, included in the silicon nitride film 34 can be prevented from spreading upward from the silicon nitride film 34. In this case, the silicon oxide film 35 is grown by the low pressure CVD under conditions of a flow of a $SiH_4$ gas of 50 sccm, a flow of a $N_2O$ gas of 2.5 slm and a temperature of 825° C.

Figure 15C:
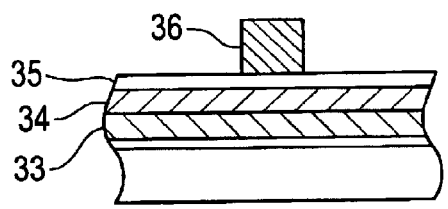

Next, in the procedure shown in FIG. 15(c), a resist mask 36 is formed on the silicon oxide film 35 in the same manner as in Embodiment 1.

Figure 15D:
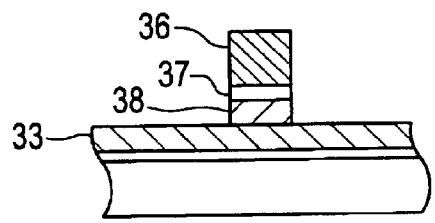

Then, in the procedure shown in FIG. 15(d), by using the resist mask 36 as an etching mask, the silicon oxide film 35 and the silicon nitride film 34 are dry etched by using a dry etcher under the same conditions as described in Embodiment 1. Thus, an oxide film pattern 37 and a surface protecting film 38 are formed.

Figure 15E:
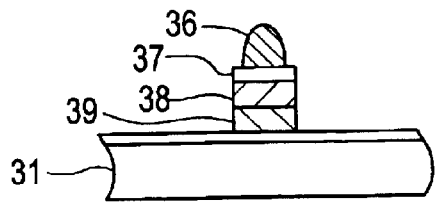

Subsequently, in the procedure shown in FIG. 15(e), by using the resist mask 36, the oxide film pattern 37 and the surface protecting film 38 as an etching mask, the polysilicon film 33 is dry etched by using a dry etcher under the same conditions as described in Embodiment 1, thereby forming a polysilicon pattern 39.

As a characteristic of the method of manufacturing an electronic device of this embodiment, the silicon oxide film 35 is first formed on the silicon nitride film 34 by the low pressure CVD and then the silicon oxide film 35 and the silicon nitride film 34 are etched. As a result, the impurity included in the silicon nitride film 34 can be suppressed from spreading upward from the silicon nitride film 34. Therefore, it is possible to prevent the impurity from reacting with the etching gas used in etching the silicon nitride film 34 to produce a salt of halide. Accordingly, the number of pattern defects caused in the polysilicon pattern 39 formed by etching the polysilicon film 33 in the subsequent procedure can be decreased.

Figure 16:
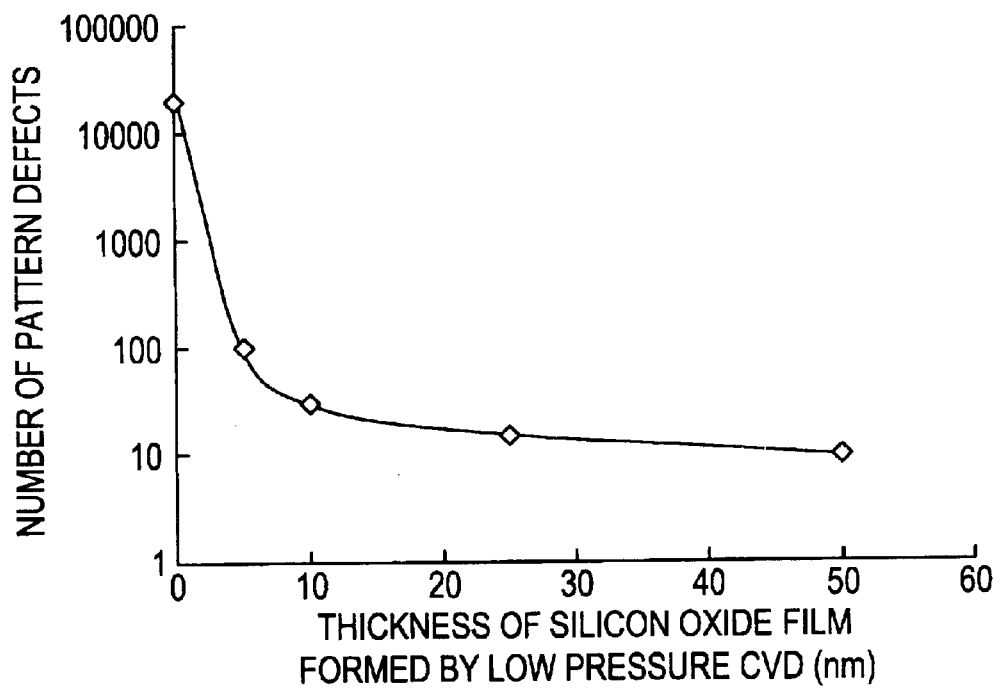
FIG. 16 is a graph for showing the relationship between the thickness of a silicon oxide film deposited on the silicon nitride film by low pressure CVD and the number of pattern defects caused in a polysilicon pattern in Embodiment 9.

FIG. 16 is a graph for showing the relationship between the thickness of the silicon oxide film 35 deposited on the silicon nitride film 34 by the low pressure CVD and the number of pattern defects caused in the polysilicon pattern 39. In FIG. 16, the abscissa indicates the thickness (in nm)

of the silicon oxide film formed by the low pressure CVD and the ordinate indicates the number of pattern defects. As is shown in FIG. 16, the presence of the silicon oxide film 35 on the silicon nitride film 34 can decrease the number of pattern defects caused in the polysilicon pattern 39. The number of pattern defects can be thus decreased because the impurity such as ammonia ($NH_3$) and hydrazine ($N_2H_4$) can be prevented from spreading upward from the silicon nitride film 34 by the silicon oxide film 35. Specifically, the impurity is prevented from reacting with F atoms of the $CHF_3$ gas used in etching the silicon nitride film 34 to form a salt of halide, and hence, the number of pattern defects caused in the polysilicon pattern 39 formed by etching the polysilicon film 33 in the subsequent procedure can be decreased. In addition, the number of pattern defects is smaller as the thickness of the oxide film is larger as is shown in FIG. 16.

In this manner, according to this embodiment, the impurity included in the silicon nitride film 34 can be prevented from spreading upward by depositing the silicon oxide film 35 on the silicon nitride film 34. Accordingly, a deposition is scarcely grown after etching the silicon nitride film 34, and hence, the occurrence of pattern defects in the polysilicon pattern 39 formed by etching the polysilicon film 33 can be suppressed. Furthermore, the number of pattern defects can be more effectively decreased as the thickness of the silicon oxide film is larger.

Although the silicon oxide film 35 is formed by the low pressure CVD in this embodiment, low temperature CVD such as plasma CVD can be used instead. In this case, the underlying film can be an aluminum film in stead of the polysilicon film.

Embodiment 10

A method of manufacturing an electronic device (semiconductor device) according to Embodiment 10 of the invention will now be described with reference to FIGS. 15(a) through 15(e) and 17. In this embodiment, a substrate is subjected to the apparently same procedures as those in Embodiment 9 shown in FIGS. 15(a) through 15(e). In this embodiment, after the procedure of FIG. 15(a), a silicon oxide film is formed not by the low pressure CVD as in Embodiment 9 but by thermal oxidation. In this manner, an impurity, namely, a residual gas, can be prevented from spreading from a silicon nitride film 34 similarly to Embodiment 9. In this embodiment, a silicon oxide film 35 is formed on the silicon nitride film 34 by the thermal oxidation of the silicon nitride film 34 with an electric furnace under conditions of a flow of an $O_2$ gas of 8 slm, a flow of a $H_2$ gas of 14.4 slm and a temperature of 1000° C.

As a characteristic of the method of manufacturing an electronic device of this embodiment, the silicon oxide film 35 is first formed on the silicon nitride film 34 by the thermal oxidation in the procedure of FIG. 15(b) and then the silicon oxide film 35 and the silicon nitride film 34 are etched. In this manner, the impurity included in the silicon nitride film 34 can be prevented from spreading upward from the silicon nitride film 34 similarly to Embodiment 9, and hence, the impurity can be prevented from reacting with an etching gas used in etching the silicon nitride film 34 to produce a salt of halide. Accordingly, the number of pattern defects caused in a polysilicon pattern 39 formed by etching a polysilicon film 33 in the subsequent procedure can be decreased.

Figure 17:
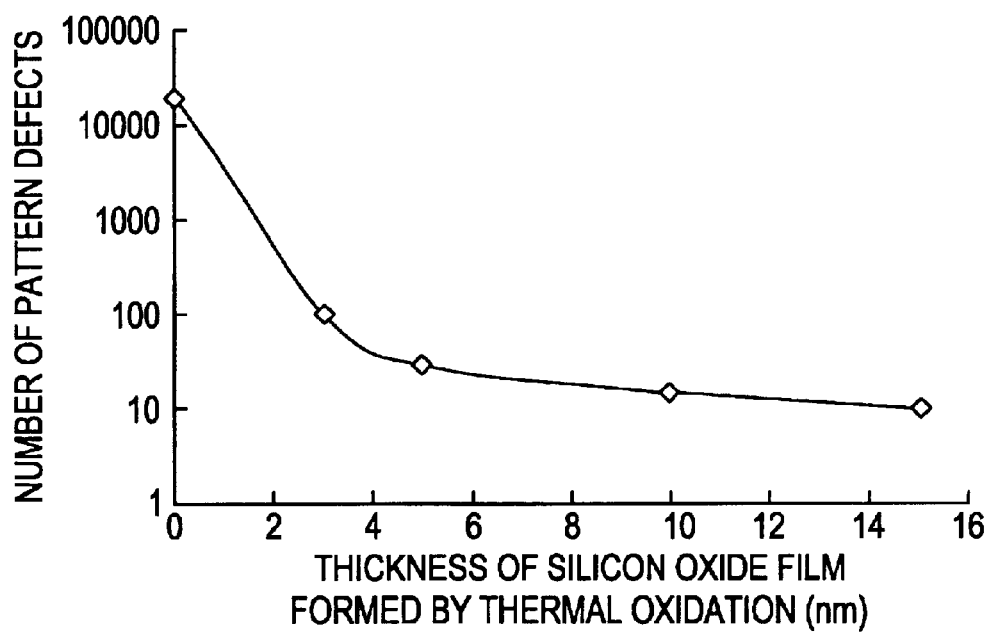
FIG. 17 is a graph for showing the relationship between the thickness of a silicon oxide film formed on the silicon nitride film by thermal oxidation and the number of pattern defects caused in a polysilicon pattern in Embodiment 10.

FIG. 17 is a graph for showing the relationship between the thickness of the silicon oxide film 35 formed on the silicon nitride film 34 by the thermal oxidation and the number of pattern defects caused in the polysilicon pattern 39. In FIG. 17, the abscissa indicates the thickness (in nm) of the silicon oxide film formed by the thermal oxidation and the ordinate indicates the number of pattern defects. As is shown in FIG. 17, the number of pattern defects is decreased as the thickness of the silicon oxide film 35 formed on the silicon nitride film 34 is larger. The number of pattern defects can be thus decreased for the same reason as described in Embodiment 9.

In this manner, according to this embodiment, the impurity can be prevented from spreading upward from the silicon nitride film 34 by forming the silicon oxide film 35 on the silicon nitride film 34. Accordingly, the occurrence of pattern defects in the polysilicon pattern 39 formed by etching the polysilicon film 33 can be suppressed.

Embodiment 11

A method of manufacturing an electronic device (semiconductor device) according to Embodiment 11 of the invention will now be described with reference to FIGS. 18(a) through 18(d) and 19. FIGS. 18(a) through 18(d) are sectional views for showing procedures from deposition of a silicon nitride film to patterning of a polysilicon film in this embodiment.

Figure 18A:
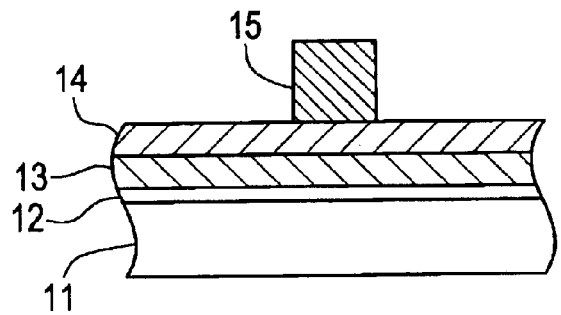
FIGS. 18(a) through 18(d) are sectional views for showing procedures from deposition of a silicon nitride film to patterning of a polysilicon film in Embodiment 11 of the invention.

First, in the procedure shown in FIG. 18(a), a gate oxide film 12 with a thickness of 10 nm, a polysilicon film 13 with a thickness of 100 nm and a silicon nitride film 14 with a thickness of 150 nm are successively deposited on a silicon substrate 11 under the same conditions as described in Embodiment 1.

Then, in the same manner as described in Embodiment 1, the silicon nitride film 14 is coated with a chemically amplified resist to form a resist film, which is formed into a resist mask 15 with a thickness of 0.7 µm by the lithography using KrF excimer laser.

Figure 18B:
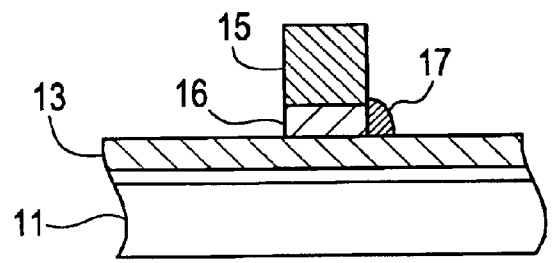

Next, in the procedure shown in FIG. 18(b), by using the resist mask 15 as an etching mask, the silicon nitride film 14 is dry etched by using a dry etcher, thereby forming a surface protecting film (nitride film mask) 16. In this embodiment, the etching is conducted with a general parallel plate reactive ion etching system by using, for example, a $CHF_3$ gas and an $O_2$ gas as reaction gases at a flow of 100 and 10 sccm, respectively at a gas pressure of 100 Pa and RF power of 400 W. After the etching, a deposition 17, a contaminant, is locally grown in the vicinity of the interface between the resist mask 15 and the surface protecting film 16. This contaminant is made from the same compounds as those described in Embodiment 1.

Figure 18C:
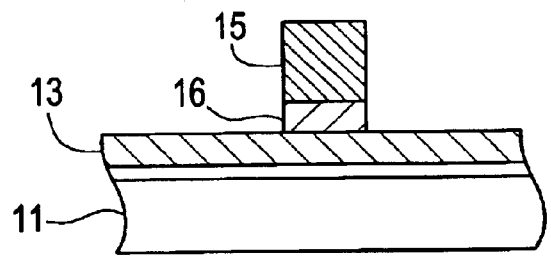

Then, in the procedure shown in FIG. 18(c), the deposition 17 including an acidic fluorine compound is removed by neutralizing the deposition 17 and cleaning the substrate bearing the resist mask 15 with an alkaline aqueous solution of TMAH (tetramethyl ammonium hydride) (with a concentration of 3%). Through this neutralization cleaning with the alkaline solution, the deposition 17 can be removed without removing the resist mask 15. As a result, the resist mask 15 and the surface protecting film 16 remain on the substrate.

Figure 18D:
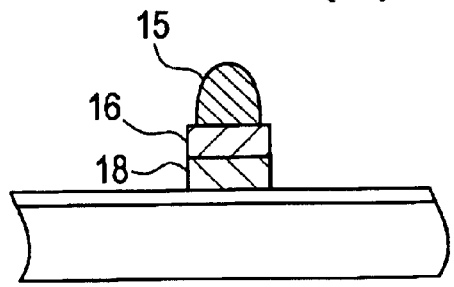

Next, in the procedure shown in FIG. 18(d), by using the resist mask 15 and the surface protecting film 16 as an etching mask, the polysilicon film 13 is dry etched by using a dry etcher, thereby forming a polysilicon pattern 18.

Figure 19:
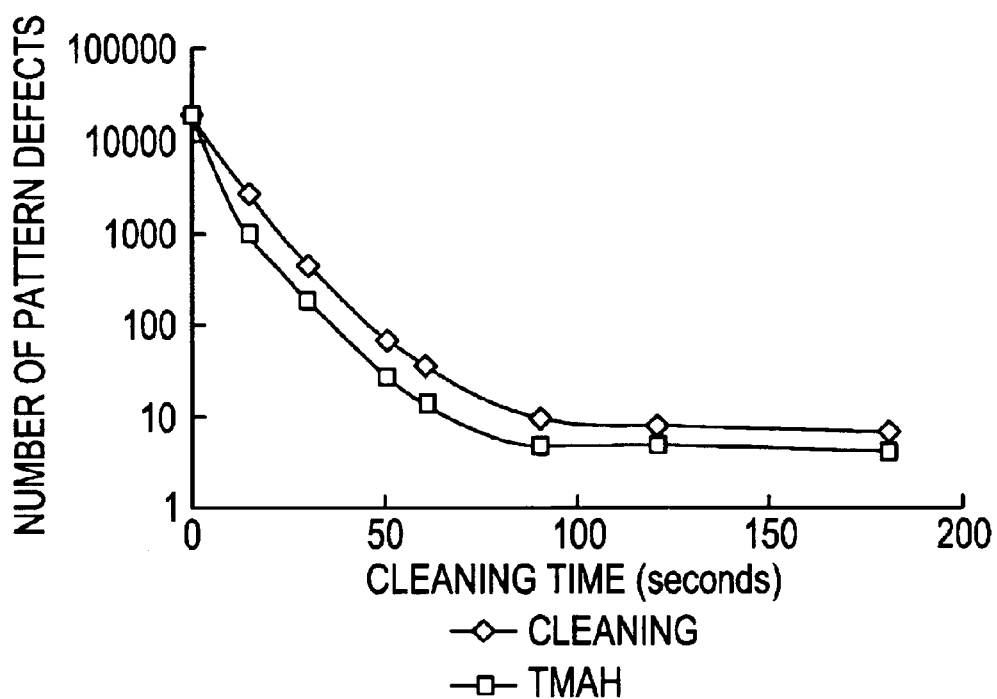
FIG. 19 is a graph for showing the relationship between time of cleaning with water and cleaning with TMAH conducted after etching the silicon nitride film and the number of pattern defects caused in a polysilicon pattern in Embodiment 11.

FIG. 19 is a graph for showing the relationships, in the cleaning with water alone and the cleaning with TMAH, between the time of the cleaning conducted after etching the silicon nitride film 14 and the number of pattern defects caused in the polysilicon pattern 17. In FIG. 19, the abscissa indicates the cleaning time (in seconds) and the ordinate indicates the number of pattern defects. In this case, the temperatures of pure water and the TMAH aqueous solution used in the cleaning are both 20° C. As is shown in FIG. 19, as the cleaning time is longer, the number of pattern defects caused in the polysilicon pattern 17 formed by etching the polysilicon film 13 is decreased in both the cleaning. Also, the number of pattern defects can be more effectively decreased by the neutralization cleaning with the TMAH aqueous solution than by the cleaning with pure water. This means that the deposition 17 can be more effectively removed through the neutralization cleaning with the TMAH aqueous solution.

In this manner, according to this embodiment, the deposition 17 grown in the vicinity of the interface between the resist mask 15 and the surface protecting film 16 can be removed without removing the resist mask 15 by cleaning the substrate with the TMAH aqueous solution, that is, an alkaline solution, after etching the silicon nitride film 14. Accordingly, the occurrence of pattern defects in the polysilicon pattern 18 formed by etching the polysilicon film 13 can be suppressed. In particular, the number of pattern defects can be more effectively decreased when the cleaning time is 50 seconds or more.

Also, TMAH is generally used as a developer for a resist and hence has an advantage that it does not spoil the shape of the resist.

Although the TMAH aqueous solution is used as an alkaline solution in this embodiment, the same effect can be attained by using any other alkaline solution having a function to neutralize and clean the deposition instead of the TMAH aqueous solution.

Embodiment 12

A method of manufacturing an electronic device (semiconductor device) according to Embodiment 12 of this invention will now be described with reference to FIGS. 20(a) through 20(e) and 21. FIGS. 20(a) through 20(e) are sectional views for showing procedures from formation of a TiN film to patterning of a metallic film in this embodiment.

Figure 20A:
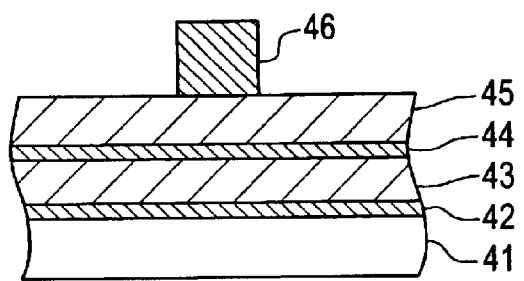
FIGS. 20(a) through 20(e) are sectional views for showing procedures from formation of a TiN film to patterning of a metallic film in Embodiment 12 of the invention.

First, in the procedure shown in FIG. 20(a), a TiN film 42 with a thickness of 50 nm, an aluminum film 43 with a thickness of 0.45 $\mu$m and a TiN film 44 with a thickness of 30 nm are successively deposited by the reactive sputtering and the general sputtering on a silicon oxide film 41 (for example, an interlayer insulating film or isolation insulating film) formed on a substrate. On this TiN film 44, a silicon oxide film 45 with a thickness of 150 nm is deposited by plasma CVD.

Thereafter, in the same manner as described in Embodiment 1, the silicon oxide film 45 is coated with a chemically amplified resist to form a resist film, which is formed into a resist mask 46 with a thickness of 0.7/$\mu$M by the lithography using KrF excimer laser.

Figure 20B:
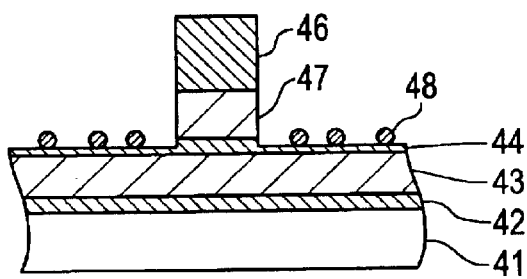

Next, in the procedure shown in FIG. 20(b), by using the resist mask 46 as an etching mask, the silicon oxide film 45 is dry etched by using a dry etcher. Thus, a hard mask 47 for TiN is formed. In this embodiment, the etching is conducted with a general parallel plate reactive ion etching system by using, for example, $CHF_3$ and $O_2$ as reaction gases at a flow of 100 and 10 sccm at a gas pressure of 100 Pa and RF power of 400 W. At this point, the TiN film 44 is also partially etched due to over-etching.

Figure 22A:
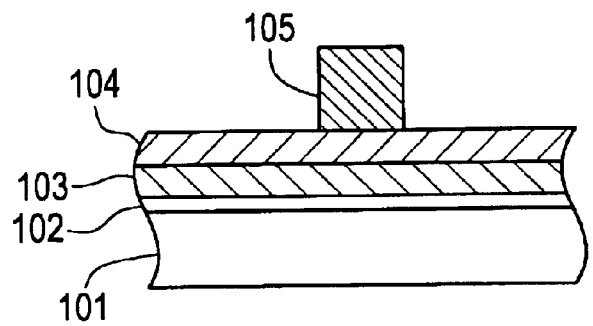
FIGS. 22(a) through 22(c) are sectional views for showing procedures in pattern formation of a silicon nitride film and a polysilicon film in a conventional method of manufacturing an electronic device.
Figure 22B:
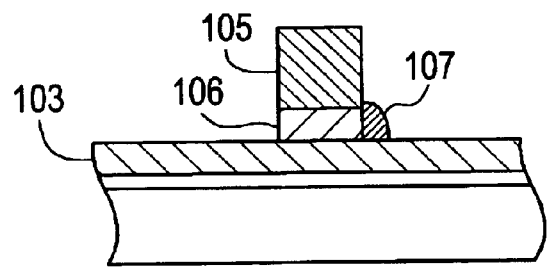
Figure 22C:
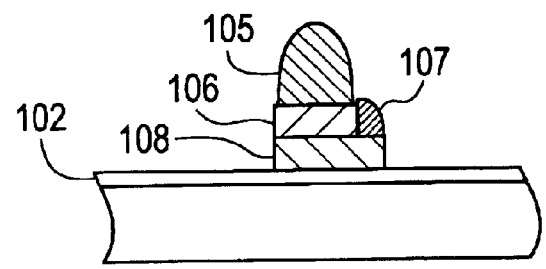
Figure 23A:
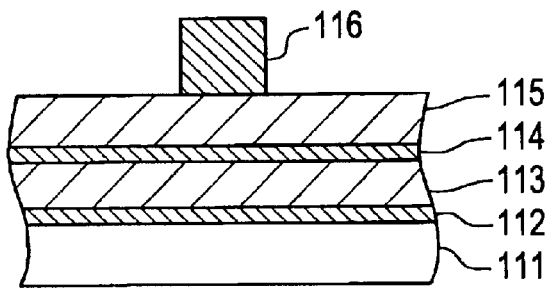
FIGS. 23(a) through 23(d) are sectional views for showing conventional procedures for forming a metallic line layer.
Figure 23B:
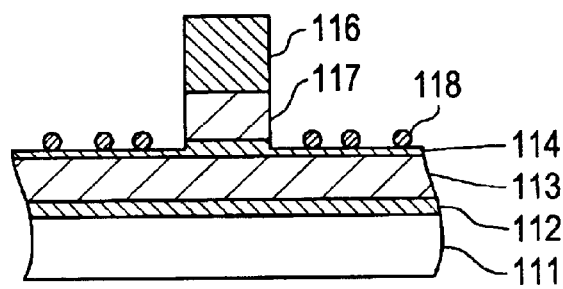
Figure 23C:
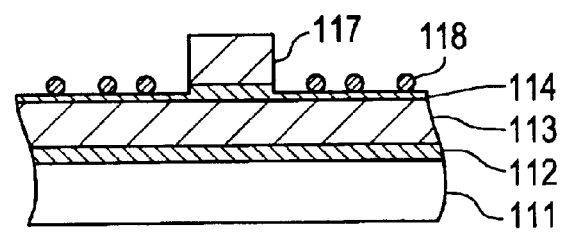
Figure 23D:
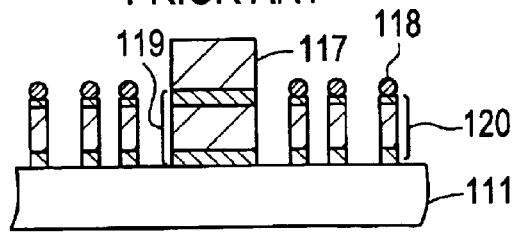

After this etching, a deposition 48 is locally grown as a contaminant on the TiN film 44. This contaminant is grown probably because Ti included in the TiN film 44 reacts with F included in the etching gas so as to locally produce a fluoride of titanium, which may grow into the deposition 48. It is generally known that a reaction between Ti and F produces gaseous $TiF_3$ and solid $TiF_3$. Therefore, the deposition 48 is regarded as solid $TiF_3$ or the like. This reaction product exists comparatively unstably, but when the TiN film 44, the aluminum film 43 and the TiN film 42 serving as the underlying films are etched without removing the reaction product, pattern defects are caused in a member obtained by patterning these films as is shown in FIG. 22(c).

Furthermore, when the substrate bearing the deposition 48 is exposed to the air, it becomes difficult to remove the deposition 48, and even if ashing and cleaning are carried out thereafter, the deposition 48 is difficult to remove.

Figure 20C:
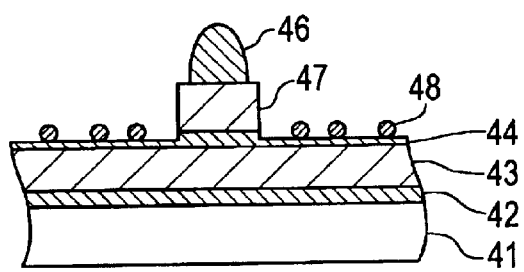

Therefore, in the procedure shown in FIG. 20(c), with the substrate kept in vacuum, an $O_2$ plasma treatment is conducted, thereby removing the deposition 48. In this case, a general parallel plate reactive ion etching system is used so as to conduct the etching under conditions of a flow of $O_2$ serving as a reaction gas of 200 sccm, a pressure of 50 mTorr and RF power of 400 W with the substrate heated at 30° C. At this point, the resist mask 46 is partially or entirely removed because the resist mask 46 is also etched.

Figure 20D:
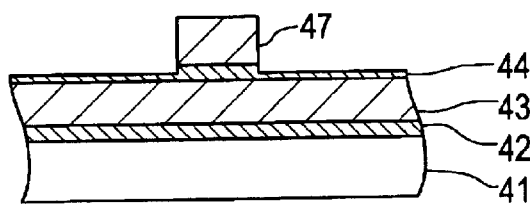

Next, in the procedure shown in FIG. 20(d), the resist mask 46 is removed through ashing and cleaning. The ashing is conducted by the down stream method by using an aqueous solution of ammonium fluoride as a cleaning solution.

Figure 20E:
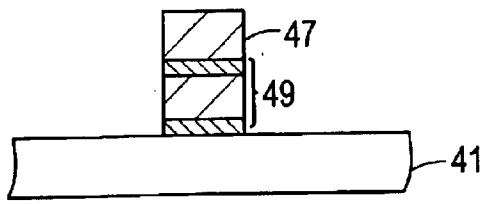

Thereafter, in the procedure shown in FIG. 20(e), by using the hard mask 47 for TiN as an etching mask, the underlying metallic films (stacked films including the TiN films 44, the aluminum film 43 and the TiN film 42) are etched by using a metal dry etcher, thereby forming a metallic pattern (metallic line) 49. In this embodiment, the etching is conducted with a general parallel plate reactive ion etching system under conditions of a flow of $BCl_3$ and $Cl_2$ serving as reaction gases of 30 and 40 sccm, respectively at a gas pressure of 10 Pa and RF power of 250 W.

FIG. 21 is a graph for showing the relationship between the time of the $O_2$ plasma treatment conducted after etching the silicon oxide film and the number of pattern defects caused in the metallic pattern 49 obtained by etching the metallic films (the stacked films of the TiN film 44, the aluminum film 43 and the TiN film 42). In FIG. 21, the abscissa indicates the time of the discharge (in seconds) and the ordinate indicates the number of pattern defects. As is shown in FIG. 21, the number of pattern defects caused in the metallic pattern 49 formed by patterning the metallic films is decreased as the time of the plasma treatment is longer. This means that the deposition 48 can be effectively removed by the $O_2$ plasma treatment.

In this manner, according to this embodiment, the deposition 48 grown on the TiN film after etching the silicon oxide film 45 is removed by the $O_2$ plasma treatment, so as to suppress the occurrence of pattern defects in the metallic pattern 49 formed by etching the metallic films. In addition, the number of pattern defects can be more effectively decreased as the time of the $O_2$ plasma treatment is longer.

Although the $O_2$ gas is used in the plasma treatment for removing the deposition in this embodiment, the same effect can be attained by using $N_2$ or any other inert gas such as Ar that does not affect the etching characteristic.

Although the hard mask 47 for TiN is formed from a silicon oxide film in this embodiment, the same effect can be attained when the hard mask for TiN is formed from a silicon nitride film or a silicon oxinitride film.

Embodiment 13

A method of manufacturing an electronic device 59 (semiconductor device) according to Embodiment 13 of the invention will now be described with reference to FIGS. 24(a) through 24(d) and 25. FIGS. 24(a) through 24(d) are sectional views for showing part of procedures for forming an STI (shallow trench isolation) in this embodiment.

Figure 24A:
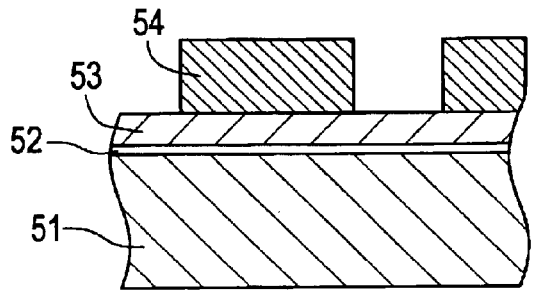
FIGS. 24(a) through 24(d) are cross-sectional views for showing part of procedures for forming an STI in Embodiment 13 of the invention.

First, in the procedure of FIG. 24(a), after forming a pad oxide film 52 with a thickness of 20 nm on a Si substrate 51 by thermal oxidation, a silicon nitride film 53 with a thickness of 160 nm is deposited by the low pressure CVD. The silicon nitride film 53 is deposited under conditions of a flow of $N_2$ of 50 sccm, a flow of $NH_3$ of 600 sccm, a flow of $SiH_2Cl_2$ of 60 sccm, a gas pressure of 40 Pa and a temperature of 760° C.

The underlying layer of this invention corresponds to a surface portion of the Si substrate 51 where the STI is to be formed in this embodiment.

Thereafter, in the same manner as in Embodiment 1, a resist film is formed by applying a chemically amplified resist on the silicon nitride film 53, and the resist film is formed into a resist mask 54 with a thickness of 0.7 ìm by the lithography using KrF excimer laser.

Figure 24B:
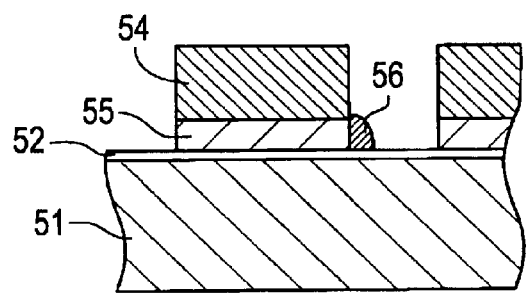

Next, in the procedure of FIG. 24(b), the silicon nitride film 53 and the pad oxide film 52 are dry etched by using a dry etcher with the resist mask 54 used as an etching mask. Thus, a hard mask 55 for use in forming the STI is obtained. In this case, the etching is carried out by using a general parallel plate reactive ion etching system with $CHF_3$ and $O_2$ used as reaction gases respectively at a flow of 100 sccm and 10 sccm and at a gas pressure of 20 Pa with RF power of 400 W.

After this etching, a deposition 56 is locally grown as a contaminant on the pad oxide film 52. However, the pad oxide film 52 can be also removed subsequently to the etching of the silicon nitride film 53, and in this case, the deposition is formed on the Si substrate 51. This contaminant is probably an ammonium fluoride ($NH_4F$) containing compound generated through a reaction between ammonia ($NH_3$) used in the deposition of the silicon nitride film 53 and fluorine included in the etching gas. Although such a reaction product exists in a comparatively unstable state, if the Si substrate 51 serving as the underlying layer is etched without removing the deposition, the deposition 56 works as a micro mask, which causes pattern defects in the STI.

Figure 24C:
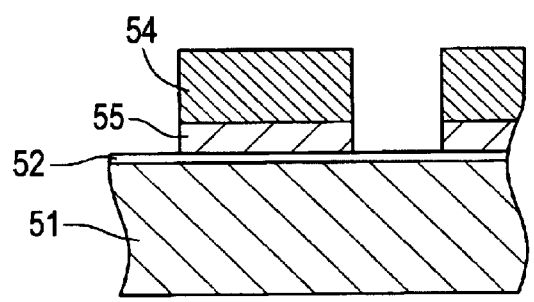

Therefore, in the procedure of FIG. 24(c), the deposition 56 is removed by cleaning the substrate bearing the resist mask 54 with pure water ($H_2O$) at room temperature or cleaning and neutralizing it with a TMAH aqueous solution (in a concentration of 3%), that is, an alkaline solution. It is found that the deposition 56 can be removed without removing the resist mask 54 through the cleaning with pure water or the neutralization cleaning with the alkaline solution. In this manner, the resist mask 54 and the hard mask 55 remain on the Si substrate 51.

Figure 24D:
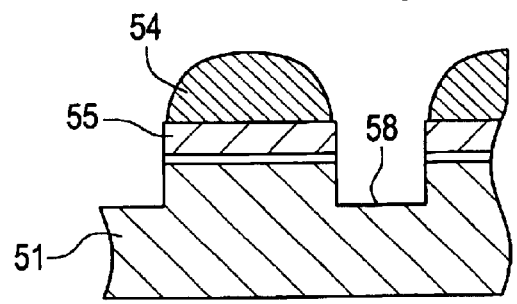

Next, in the procedure of FIG. 24(d), the pad oxide film 52 and the Si substrate 51 are dry etched by using a dry etcher with the resist mask 54 and the hard mask 55 used as an etching mask, thereby forming a trench 58 for use as the isolation region. At this point, the etching is carried out without removing the resist mask 54 for the following reason: If the resist mask 54 is removed, the hard mask 55 is also etched to some extent so as to reduce in its thickness. Therefore, when CMP for filling the trench with a silicon oxide film is subsequently carried out, the thickness of an isolation insulating film is disadvantageously varied.

Although the following procedures are not shown in drawings, after depositing a CVD oxide film on the substrate, the CVD oxide film is planarized by the CMP, so as to form an isolation insulating film from the oxide film filled in the trench 58. In this process, known STI formation technique is utilized.

Figure 25:
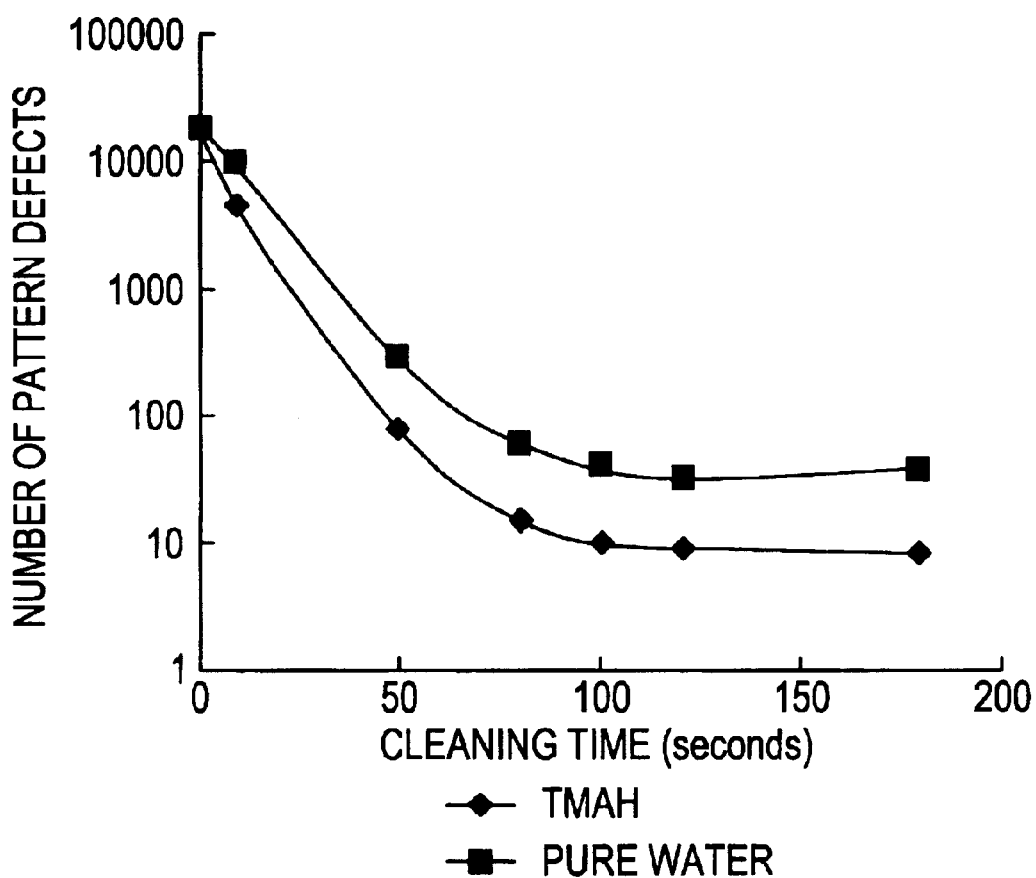
FIG. 25 is a diagram of the relationship between time of cleaning carried out after etching a silicon nitride film and the number of pattern defects caused after forming a trench in Embodiment 13 for showing comparison between cleaning with water and cleaning accompanied with neutralization with TMAH.

FIG. 25 is a diagram of the relationship between the time of the cleaning carried out after etching the silicon nitride film 53 and the number of pattern defects caused after forming the trench for showing comparison between the cleaning with water and the cleaning accompanied with neutralization with TMAH. In FIG. 25, the abscissa indicates the cleaning time (in seconds) and the ordinate indicates the number of pattern defects. In this case, the temperatures of the pure water and the TMAH aqueous solution used in the cleaning are both 20° C. As shown in FIG. 25, the number of pattern defects in the trench 58 formed by etching the Si substrate 51 is reduced as the cleaning time is longer in both the cleaning. Also, the number of pattern defects can be more effectively reduced by the neutralization cleaning with the TMAH aqueous solution than by the cleaning with pure water. This means that the deposition 56 can be more effectively removed by the neutralization cleaning with the TMAH aqueous solution.

As described above, according to this embodiment, in the procedures for forming the STI, after etching the silicon nitride film 53 to be formed into the hard mask, the substrate is cleaned with pure water or neutralized and cleaned with the TMAH aqueous solution, that is, an alkaline solution, without removing the resist mask 54, so that the deposition 56 formed in the vicinity of the edge face of the hard mask 55 can be removed. Accordingly, the occurrence of pattern defects in the trench 58 formed by etching the surface portion of the Si substrate 51 (corresponding to the underlying layer) can be suppressed. Also, as the time of the cleaning with pure water or the cleaning accompanied with the neutralization with the TMAH aqueous solution is longer, the number of pattern defects can be more effectively reduced. In particular, when the cleaning time is 50 seconds or more, the number of pattern defects can be more effectively reduced.

Moreover, the number of pattern defects can be further more effectively reduced through the neutralization cleaning using the TMAH aqueous solution. Since TMAH is used as a developer for a resist, it has an advantage that it does not spoil the shape of the resist.

Although the TMAH aqueous solution is used as an alkaline solution in this embodiment, the same effect can be exhibited by using, instead of the TMAH aqueous solution, another alkaline solution having a function to neutralize and clean the deposition.

Embodiment 14

A method of manufacturing an electronic device (semiconductor device) according to Embodiment 14 of the invention will now be described with reference to FIGS. 26(a) through 26(d) and 27. FIGS. 26(a) through 26(d) are sectional views for showing part of procedures for forming an interconnect by the single damascene method in this embodiment.

Figure 26A:
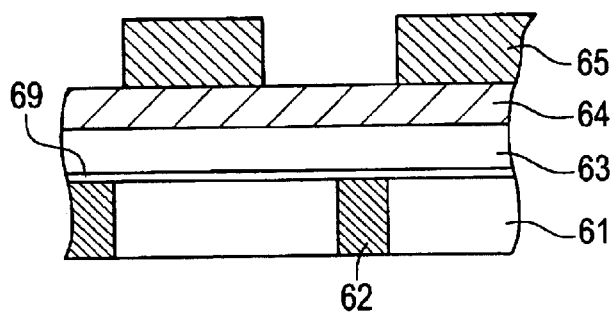
FIGS. 26(a) through 26(d) are cross-sectional views for showing part of procedures for forming an interconnect by the single damascene method in Embodiment 14.

In the procedure of FIG. 26(a), a Cu plug 62 connected to a diffusion layer within a Si substrate below or connected to an interconnect on an interconnect layer below is formed in a part of a SiOC-based lower interlayer insulating film 61 provided on the Si substrate. A SiOC-based upper interlayer insulating film 63 serving as the underlying layer is deposited on the lower interlayer insulating film 61. In some cases, a SiN film 69 for preventing diffusion of Cu may be formed between the lower interlayer insulating film 61 and the upper interlayer insulating film 63, and this SiN film not only has the Cu diffusion preventing function but also has an etching stopper function, whereas the SiN film is not always necessary.

A SiON (silicon oxinitride) film 64 (anti-reflection film) with a thickness of 35 nm for preventing reflection of light in the photolithography is formed on the upper interlayer insulating film 63 by plasma CVD.

Thereafter, in the same manner as in Embodiment 1, a resist film is formed by applying a chemically amplified resist on the SiON film 64, and the resist film is formed into a resist mask 65 with a thickness of 0.7 ìm by the lithography using KrF excimer laser.

Figure 26B:
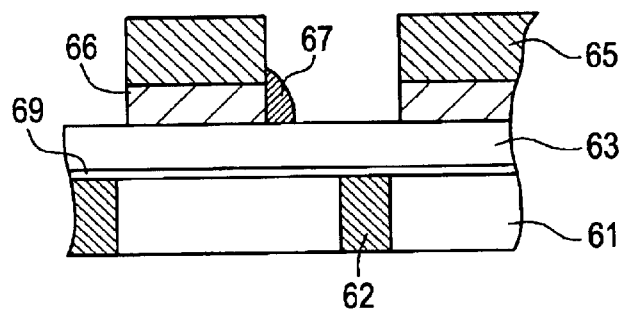

Next, in the procedure of FIG. 26(b), the SiON film 64 is dry etched by using a dry etcher with the resist mask 65 used as an etching mask, thereby forming a hard mask 66. In this case, the etching is carried out by using a general parallel plate reactive ion etching system with, for example, $C_5F_8$, Ar and $O_2$ used as reaction gases respectively at a flow of 20 sccm, 200 sccm and 10 sccm and at a gas pressure of 5 Pa with RF power of 800 W.

After this etching, a deposition 67 is locally grown as a contaminant on the upper interlayer insulating film 63. This contaminant is probably an ammonium fluoride ($NH_4F$) containing compound generated through a reaction between ammonia ($NH_3$) used in the deposition of the SiON film 64 and fluorine included in the etching gas. Although such a reaction product exists in a comparatively unstable state, if the upper interlayer insulating film 63 serving as the underlying layer is etched without removing the deposition, the deposition 67 works as a micro mask, which causes pattern defects in the interconnect.

Figure 26C:
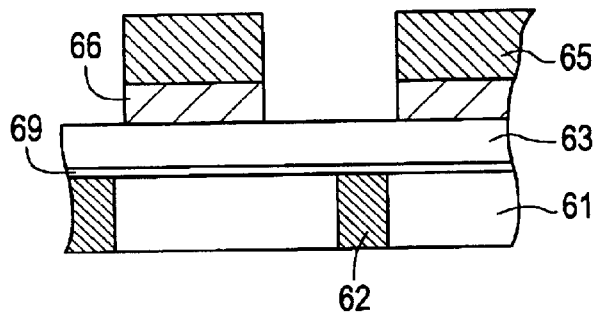

Therefore, in the procedure of FIG. 26(c), the deposition 67 is removed by cleaning the substrate bearing the resist mask 65 with pure water ($H_2O$) at room temperature or cleaning and neutralizing it with a TMAH aqueous solution (in a concentration of 3%), that is, an alkaline solution. It is found that the deposition 67 can be removed without removing the resist mask 65 through the cleaning with pure water or the neutralization cleaning with the alkaline solution. In this manner, the resist mask 65 and the hard mask 66 remain on the upper interlayer insulating film 63.

Figure 26D:
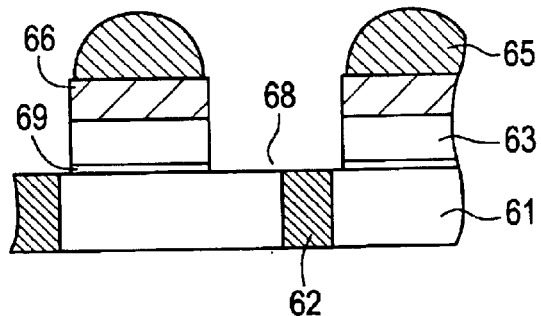

Next, in the procedure of FIG. 26(d), the upper interlayer insulating film 63 is dry etched by using a dry etcher with the resist mask 65 and the hard mask 66 used as an etching mask, thereby forming a trench 68 for burying the interconnect. At this point, the etching is carried out without removing the resist mask 65 for the following reason: If the resist mask 65 is removed, the hard mask 66 is also etched to some extent so as to reduce in its thickness. Therefore, when the CMP for filling the trench with a Cu film for forming the interconnect is subsequently carried out, the thickness of the interconnect is disadvantageously varied.

Although the following procedures are not shown in drawings, after depositing a Cu film on the substrate, the Cu film is planarized by the CMP, so as to form an interconnect from the Cu film filled in the trench 68. In this process, known single damascene technique is utilized.

Figure 27:
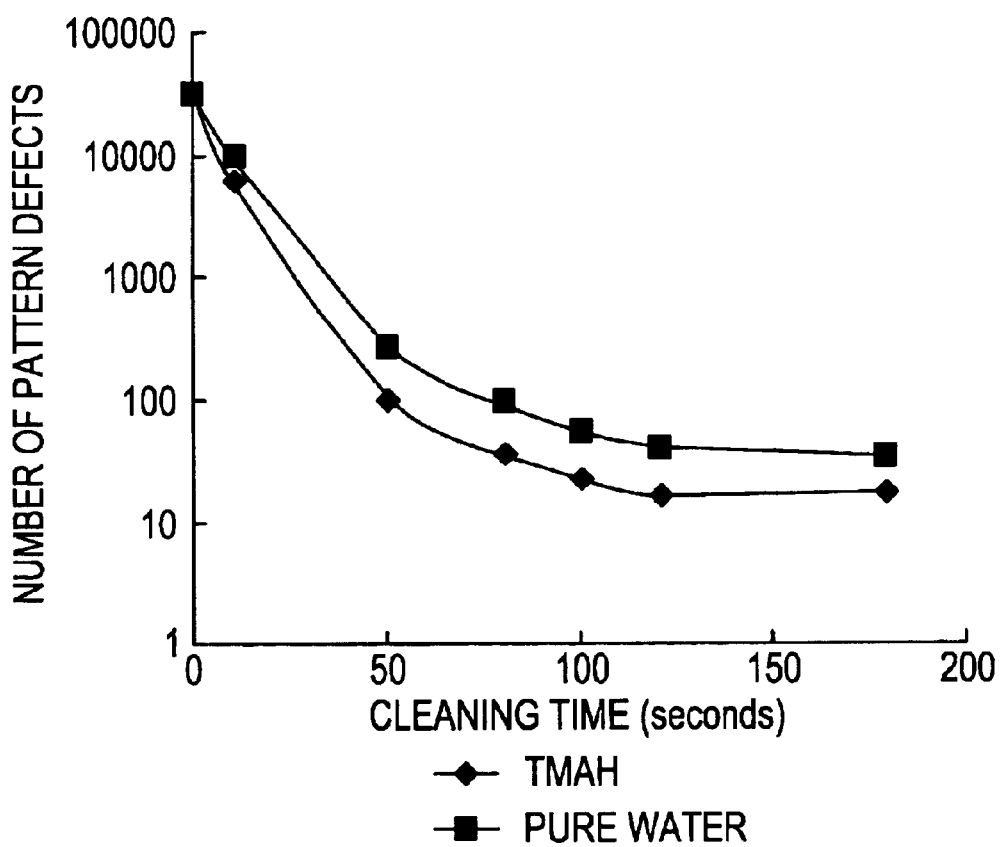
FIG. 27 is a diagram of the relationship between time of cleaning carried out after etching a SiON film and the number of pattern defects caused after forming a trench in Embodiment 14 for showing comparison between cleaning with water alone and neutralization cleaning with TMAH.

FIG. 27 is a diagram of the relationship between the time of the cleaning carried out after etching the SiON film 64 and the number of pattern defects caused after forming the trench for showing comparison between the cleaning with water and the cleaning accompanied with neutralization with TMAH. In FIG. 27, the abscissa indicates the cleaning time (in seconds) and the ordinate indicates the number of pattern defects. In this case, the temperatures of the pure water and the TMAH aqueous solution used in the cleaning are both 20° C. As shown in FIG. 27, the number of pattern defects in the trench 68 formed by etching the upper interlayer insulating film 63 is reduced as the cleaning time is longer in both the cleaning. In particular, the number of pattern defects can be more effectively reduced by the neutralization cleaning with the TMAH aqueous solution than by the cleaning with pure water. This means that the deposition 67 can be more effectively removed by the neutralization cleaning with the TMAH aqueous solution.

As described above, according to this embodiment, in the procedures for forming an interconnect by the single damascene method, after etching the SiON film 64 to be formed into the hard mask, the substrate is cleaned with pure water or neutralized and cleaned with the TMAH aqueous solution, that is, an alkaline solution, without removing the resist mask 65, so that the deposition 67 grown in the vicinity of the interface between the resist mask 65 and the hard mask 66 can be removed. Accordingly, the occurrence of pattern defects in the trench 68 formed by etching the upper interlayer insulating film 63 (corresponding to the underlying layer) can be suppressed. Also, as the time of the cleaning with pure water or the cleaning accompanied with the neutralization with the TMAH aqueous solution is longer, the number of pattern defects can be more effectively reduced.

In particular, when the cleaning time is 50 seconds or more, the number of pattern defects can be more effectively reduced.

Moreover, the number of pattern defects can be further more effectively reduced through the neutralization cleaning using the TMAH aqueous solution. Since TMAH is used as a developer for a resist, it has an advantage that it does not spoil the shape of the resist.

Although the TMAH aqueous solution is used as an alkaline solution in this embodiment, the same effect can be exhibited by using, instead of the TMAH aqueous solution, another alkaline solution having a function to neutralize and clean the deposition.

Embodiment 15

A method of manufacturing an electronic device (semiconductor device) according to Embodiment 15 of the invention will now be described with reference to FIGS. 28(a) through 28(f) and 29. FIGS. 28(a) through 28(f) are sectional views for showing part of procedures for forming an interconnect by the dual damascene method in this embodiment.

Figure 28A:
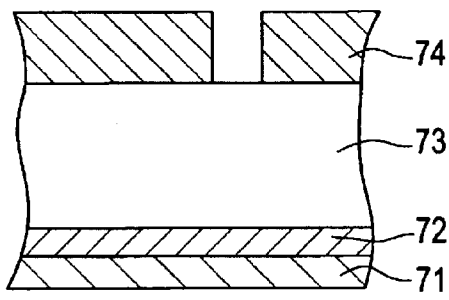
FIGS. 28(a) through 28(f) are cross-sectional views for showing part of procedures for forming an interconnect by the dual damascene method in Embodiment 15.

In the procedure of FIG. 28(a), a diffusion layer within a Si substrate or an interconnect on a lower interconnect layer is formed in a part of a substrate 71. A silicon nitride film 72 serving as the underlying layer is deposited on the substrate 71. The silicon nitride film 72 has a function to prevent diffusion of Cu and an etching stopper function.

An interlayer insulating film 73 of a silicon oxide film doped with fluorine with a thickness of 700 nm is formed on the silicon nitride film 72 by the CVD. An etching stopper film (not shown) for use in etching for forming a trench for burying an interconnect may be or may not be formed in the interlayer insulating film 73.

Thereafter, in the same manner as in Embodiment 1, a resist film is formed by applying a chemically amplified resist on the interlayer insulating film 73, and the resist film is formed into a resist mask 74 with a thickness of 0.7 ìm by the lithography using KrF excimer laser.

Figure 28B:
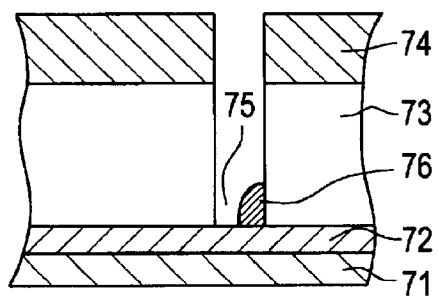

Next, in the procedure of FIG. 28(b), the interlayer insulating film 73 is dry etched by using a dry etcher with the resist mask 74 used as an etching mask, thereby forming a contact hole 75 not penetrating but stopped at the silicon nitride film 72. In this case, the etching is carried out by using a general parallel plate reactive ion etching system with, for example, $C_5F_8$, Ar and $O_2$ used as reaction gases respectively at a flow of 20 sccm, 200 sccm and 10 sccm and at a gas pressure of 5 Pa with RF power of 800 W.

After this etching, a deposition 76 is locally grown as a contaminant on the silicon nitride film 72 serving as the underlying layer. This contaminant is probably an ammonium fluoride ($NH_4F$)-containing compound generated through a reaction between ammonia (NH$_3$) used in the deposition of the silicon nitride film 72 and fluorine included in the etching gas.

Figure 28C:
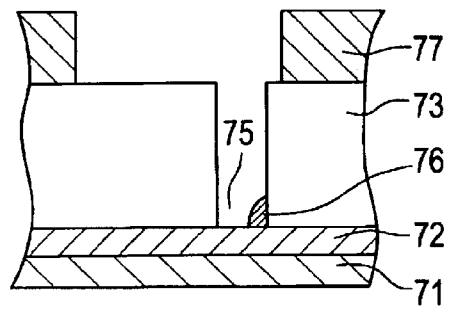

Next, in the procedure of FIG. 28(c), after removing the resist mask 74 by ashing and cleaning, another resist film is formed by applying a chemically amplified resist, and the resist film is formed by the lithography using KrF excimer laser into a resist mask 77 with a thickness of 0.7 lm used for forming a trench. At this point, the deposition 76 is corroded to some extent through the ashing and cleaning carried out for removing the resist mask 74 but is not completely removed, and hence, the deposition 76 partly remains.

Figure 28D:
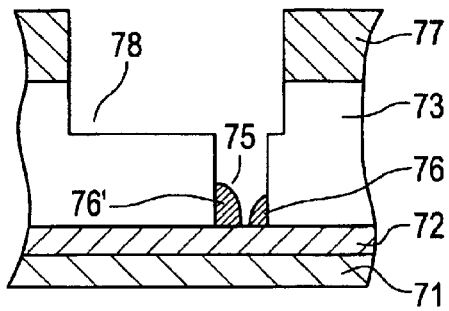

Then, in the procedure of FIG. 28(d), the interlayer insulating film 73 is dry etched by using a dry etcher with the resist mask 77 used as an etching mask, thereby forming a trench 78 in a region including the contact hole 75. This etching is carried out under the same conditions as in the procedure of FIG. 28(b).

After this etching, another deposition 76' is locally grown as a contaminant on the silicon nitride film 72 serving as the underlying layer. Also this contaminant is probably an ammonium fluoride (NH$_4$F)-containing compound generated through the reaction between ammonia (NH$_3$) used in the deposition of the silicon nitride film 72 and fluoride included in the etching gas.

Although such reaction products 76 and 76' exist in a comparatively unstable state, if the silicon nitride film 72 serving as the underlying layer is etched without removing the deposition, the depositions 76 and 76' work as micro masks, which causes pattern defects in a plug.

Figure 28E:
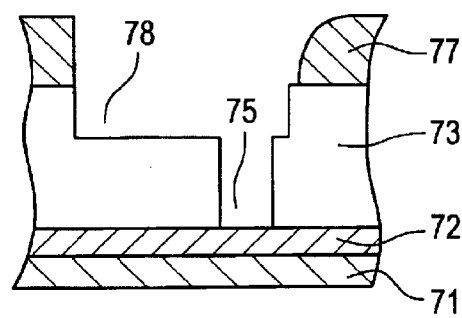

Therefore, in the procedure of FIG. 28(e), the depositions 76 and 76' are removed by cleaning the substrate bearing the resist mask 77 with pure water (H$_2$O) at room temperature or cleaning and neutralizing it with a TMAH aqueous solution (in a concentration of 3%), that is, an alkaline solution. It is found that the depositions 76 and 76' can be removed without removing the resist mask 77 through the cleaning with pure water or the neutralization cleaning with the alkaline solution. In this manner, the interlayer insulating film 73 and the resist mask 77 remain on the silicon nitride film 72.

Figure 28F:
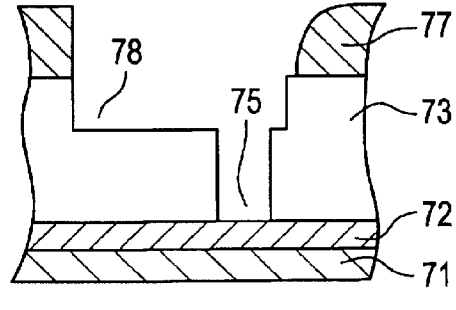

Next, in the procedure of FIG. 28(f), the silicon nitride film 72 is dry etched by using a dry etcher with the resist mask 77 and the interlayer insulating film 73 used as an etching mask, thereby further trenching the contact hole 75 for burying a plug until it reaches the diffusion layer of the substrate 71 or the interconnect below. At this point, the etching is carried out by using a general parallel plate reactive ion etching system with, for example, CHF$_3$ and O$_2$ used as etching gases respectively at a flow of 100 sccm and 10 sccm and at a gas pressure of 20 Pa with RF power of 400 W.

At this point, the etching is carried out without removing the resist mask 77 for the following reason: If the resist mask 77 is removed, also the interlayer insulating film 73 is etched to reduce in its thickness, and therefore, when the CMP for filling the trench with a Cu film used as an interconnect is subsequently carried out, the thickness of the interconnect is disadvantageously varied.

Although the following procedures are not shown in drawings, after depositing a Cu film on the substrate, the Cu film is planarized by the CMP, so as to simultaneously form a plug and an interconnect from the Cu film filled in the contact hole 75 and a trench 78. In this process, known dual damascene technique is utilized.

FIG. 29 is a diagram of the relationship between the time of the cleaning carried out in the procedure of FIG. 28(e) and the number of pattern defects caused after forming the trench for showing comparison between the cleaning with water and the cleaning accompanied with neutralization with TMAH. In FIG. 29, the abscissa indicates the cleaning time (in seconds) and the ordinate indicates the number of pattern defects. In this case, the temperatures of the pure water and the TMAH aqueous solution used in the cleaning are both 20° C. As shown in FIG. 29, the number of pattern defects in the contact hole 75 (namely, the plug) formed by etching the interlayer insulating film 73 and the silicon nitride film 72 is reduced as the cleaning time is longer in both the cleaning. Also, the number of pattern defects can be more effectively reduced by the neutralization cleaning with the TMAH aqueous solution than by the cleaning with pure water. This means that the deposition 76 can be more effectively removed by the neutralization cleaning with the TMAH aqueous solution.

As described above, according to this embodiment, in the procedures for forming an interconnect by the dual damascene method, after etching the interlayer insulating film 73, the substrate is cleaned with pure water or neutralized and cleaned with the TMAH aqueous solution, that is, an alkaline solution, without removing the resist mask 77, so that the deposition 76 grown in the vicinity of the interface between the interlayer insulating film 73 and the silicon nitride film 72 can be removed. Accordingly, the occurrence of pattern defects in the contact hole 75 penetrating through the silicon nitride film 72, and also in the Cu plug filled in the contact hole 75, can be suppressed. Also, as the time of the cleaning with pure water or the cleaning accompanied with the neutralization by using the TMAH aqueous solution is longer, the number of pattern defects can be more effectively reduced. In particular, when the cleaning time is 50 seconds or more, the number of pattern defects can be more effectively reduced.

Moreover, the number of pattern defects can be further more effectively reduced through the neutralization cleaning using the TMAH aqueous solution. Since TMAH is used as a developer for a resist, it has an advantage that it does not spoil the shape of the resist.

Although the TMAH aqueous solution is used as an alkaline solution in this embodiment, the same effect can be exhibited by using, instead of the TMAH aqueous solution, another alkaline solution having a function to neutralize and clean the deposition.

Other Embodiments

In the aforementioned Embodiments 1 through 11, a polysilicon film is used as an underlying film of a silicon nitride film. It goes without saying that the present method can be realized even when the polysilicon film is replaced with an amorphous silicon film, a silicon substrate, a silicide film such as WSi, TiSi$_2$, MoSi, NiSi and CoSi, a metallic film such as W, Cu, Ta and Al or an oxide or nitride film of such metallic films. For example, the present invention is applicable to formation of a very fine projection or trench on or in a silicon substrate. Furthermore, examples of the element of a semiconductor device capable of serving as the underlying layer are a surface portion of a silicon substrate, an electrode, an interconnect and an interlayer insulating film.

Also, in Embodiments 1 through 11, a hard mask is formed from a silicon nitride film, but the silicon nitride film can be replaced with a silicon oxinitride film, a silicon oxide film or the like. Furthermore, an organic film used in an air gap interconnect structure or an organic-inorganic hybrid film may be used instead.

Moreover, the method of manufacturing a semiconductor device alone is described in each of the aforementioned embodiments, which does not limit the invention. The same effect can be attained in applying the present invention to a method of manufacturing another electronic device such as a liquid crystal device.

Furthermore, the following processing and treatments can be appropriately combined: the cleaning with pure water described in Embodiments 1, 2 and 13 through 15; the cleaning accompanied with neutralization with diluted hydrofluoric acid described in Embodiment 3; the heat treatment subsequent to the etching described in Embodiment 4; the heat treatment under vacuum subsequent to the etching described in Embodiment 5; the $N_2$ plasma treatment described in Embodiment 6; the electron beam irradiation described in Embodiment 7; the heat treatment of the silicon nitride film prior to the etching described in Embodiment 8; the formation of the silicon oxide film on the silicon nitride film described in Embodiment 9; the thermal oxidation of the silicon nitride film described in Embodiment 10; the cleaning accompanied with neutralization described in Embodiments 11 through 15; and the $O_2$ plasma treatment described in Embodiment 12. Through the combination of these processing and treatments, an electronic device including a semiconductor device can be manufactured with the occurrence of pattern defects further effectively suppressed.

What is claimed is:

1. A method of manufacturing an electronic device comprising the steps of:
   (a) forming, on an underlying layer, an insulating film made from one of an oxide film, a nitride film, an oxide nitride film, an organic film and an organic-inorganic hybrid film;
   (b) forming a resist pattern on said insulating film;
   (c) forming an insulating film pattern by etching said insulating film with said resist pattern used as a mask;
   (d) conducting a plasma treatment on exposed portions of said underlying layer and said insulating film pattern without removing said resist pattern after the step (c); and
   (e) forming a pattern for said underlying layer by etching said underlying layer with said resist pattern and said insulating film pattern used as a mask after the step (d).

2. The method of manufacturing an electronic device of claim 1,
   wherein said plasma treatment is conducted by using a gas including at least one of a $N_2$ gas, an $O_2$ gas and an inert gas in the step (d).

* * * * *